United States Patent
Lee et al.

(10) Patent No.: US 10,043,817 B2
(45) Date of Patent: Aug. 7, 2018

(54) SEMICONDUCTOR MEMORY DEVICE

(71) Applicants: Tae-Hee Lee, Suwon-si (KR);
Hong-Soo Kim, Seongnam-si (KR);
Kyoung-Hoon Kim, Seoul (KR);
Young-Suk Lee, Daejeon (KR)

(72) Inventors: Tae-Hee Lee, Suwon-si (KR);
Hong-Soo Kim, Seongnam-si (KR);
Kyoung-Hoon Kim, Seoul (KR);
Young-Suk Lee, Daejeon (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 15/212,356

(22) Filed: Jul. 18, 2016

(65) Prior Publication Data
US 2017/0117290 A1 Apr. 27, 2017

(30) Foreign Application Priority Data
Oct. 21, 2015 (KR) .......................... 10-2015-0146661

(51) Int. Cl.
*H01L 27/115* (2017.01)
*H01L 27/11582* (2017.01)
*H01L 23/528* (2006.01)
*H01L 23/522* (2006.01)
*G11C 16/08* (2006.01)
(Continued)

(52) U.S. Cl.
CPC .... *H01L 27/11582* (2013.01); *G11C 16/0466* (2013.01); *G11C 16/0483* (2013.01); *G11C 16/08* (2013.01); *H01L 23/528* (2013.01); *H01L 23/5226* (2013.01); *H01L 27/11568* (2013.01); *H01L 27/11573* (2013.01)

(58) Field of Classification Search
CPC ............. H01L 27/11582; H01L 23/528; H01L 23/5226; H01L 27/11568; H01L 27/11573; G11C 16/0466; G11C 16/08
USPC ........................................................ 257/324
See application file for complete search history.

(56) References Cited

U.S. PATENT DOCUMENTS 6,180,448 B1   1/2001  Lee
6,380,087 B1   4/2002  Gupta et al.
(Continued)

FOREIGN PATENT DOCUMENTS

JP       2015099923       5/2015
KR    1020060076677       7/2006
(Continued)

*Primary Examiner* — Marc Armand
*Assistant Examiner* — Sue Tang
(74) *Attorney, Agent, or Firm* — Volentine, Whitt & Francos, PLLC

(57) ABSTRACT

A highly integrated semiconductor memory device includes a substrate, a plurality of vertical pillars above the substrate, a plurality of connection lines extending over the vertical pillars, a plurality of lower via plugs provided above the vertical pillars and connecting the vertical pillars to the connection lines, a dummy connection line provided at a same level as the connection lines with respect to a main surface of the substrate, and a dummy via plug connected to a lower surface of the dummy connection line and having a different height than each of the lower via plugs. The vertical pillars, the connection lines, the lower via plugs are provided in a cell region, and the dummy connection line and the dummy via plug are provided in a dummy region.

19 Claims, 40 Drawing Sheets

(51) Int. Cl.
*H01L 27/11568* (2017.01)
*H01L 27/11573* (2017.01)
*G11C 16/04* (2006.01)

(56) References Cited

U.S. PATENT DOCUMENTS

| | | | |
|---|---|---|---|
| 7,199,420 B2 | 4/2007 | Kitamura et al. | |
| 7,221,031 B2 | 5/2007 | Ryoo et al. | |
| 8,598,710 B2 | 12/2013 | Park et al. | |
| 2011/0073917 A1* | 3/2011 | Zhong | H01L 21/76819 257/208 |
| 2013/0056816 A1* | 3/2013 | Iwase | H01L 27/0738 257/316 |
| 2015/0054058 A1* | 2/2015 | Seol | H01L 29/42332 257/324 |
| 2015/0115348 A1* | 4/2015 | Nam | H01L 27/11582 257/324 |
| 2015/0145021 A1 | 5/2015 | Jang et al. | |
| 2016/0293539 A1* | 10/2016 | Park | H01L 27/0688 |
| 2017/0062330 A1* | 3/2017 | Kim | H01L 23/5226 |

FOREIGN PATENT DOCUMENTS

| | | |
|---|---|---|
| KR | 100643572 | 11/2006 |
| KR | 1020150061500 | 6/2015 |

\* cited by examiner

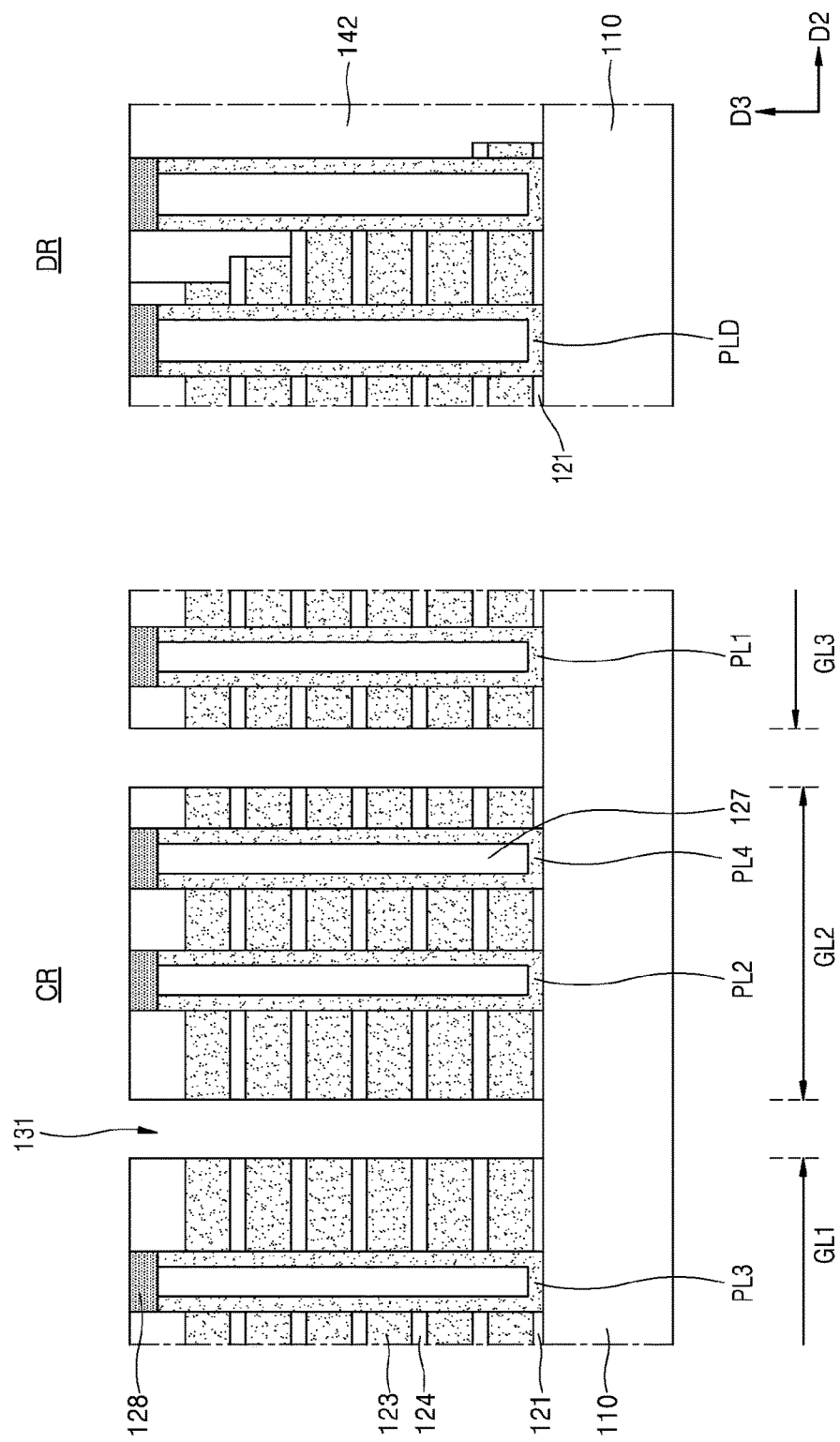

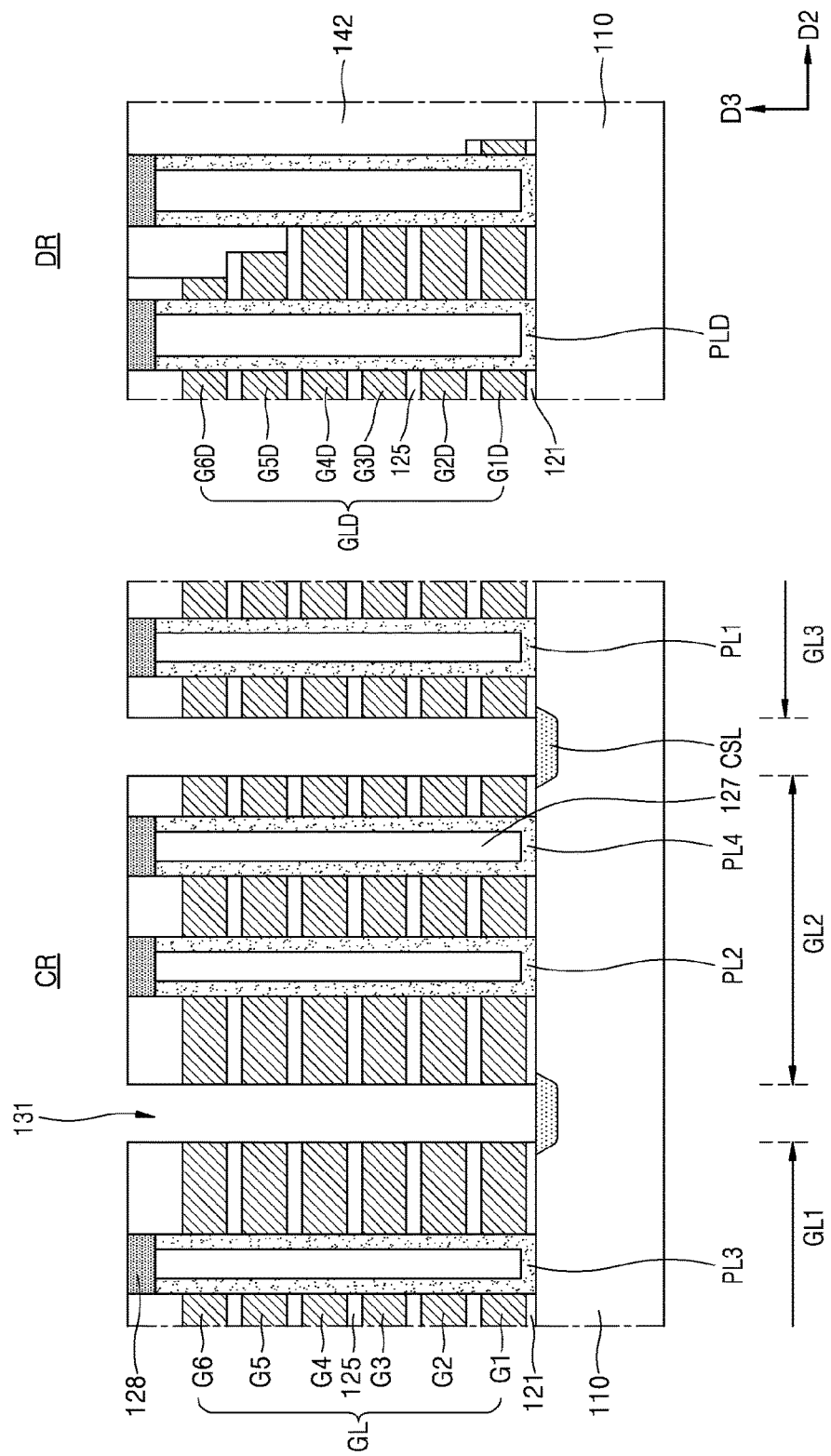

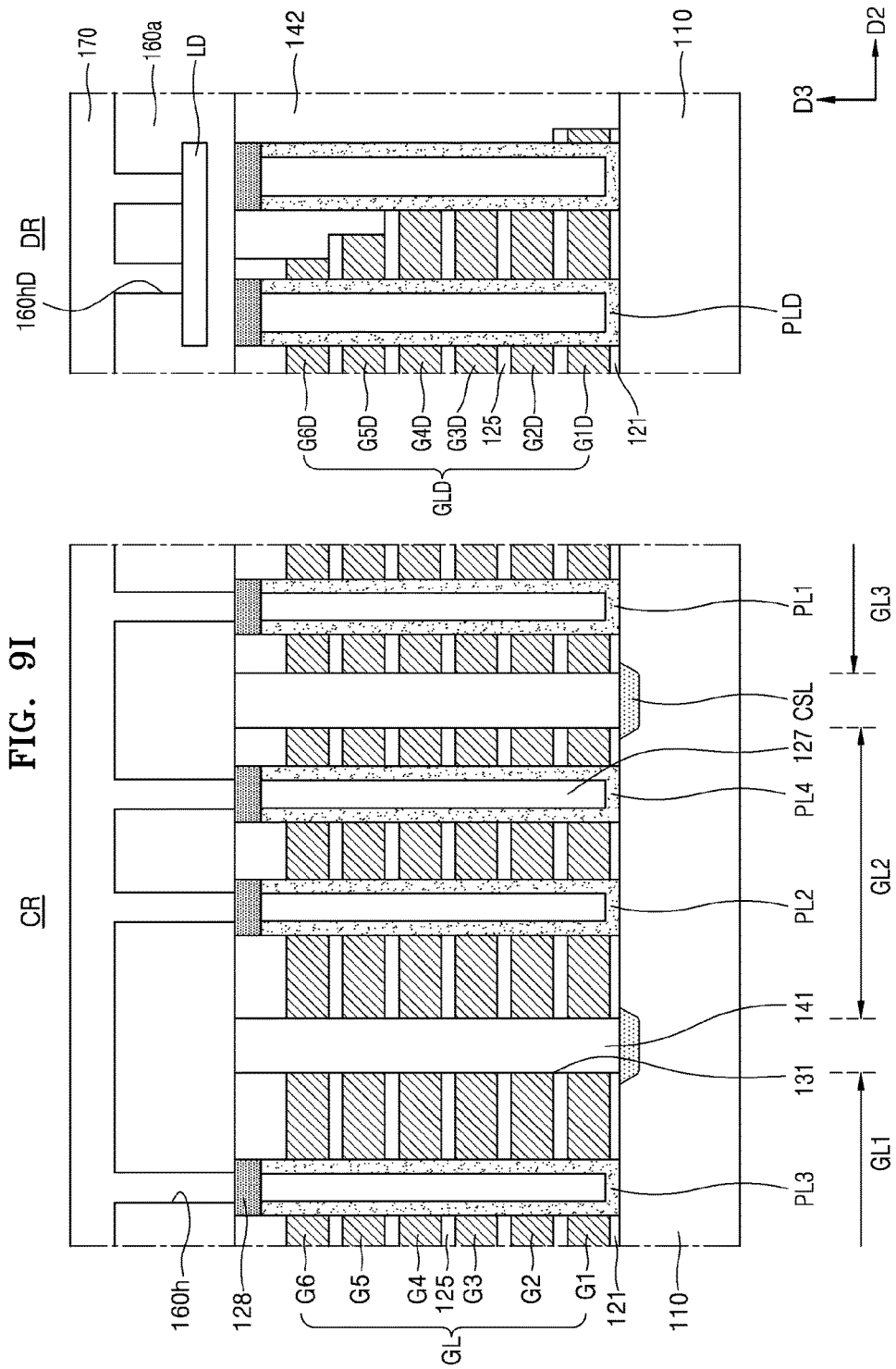

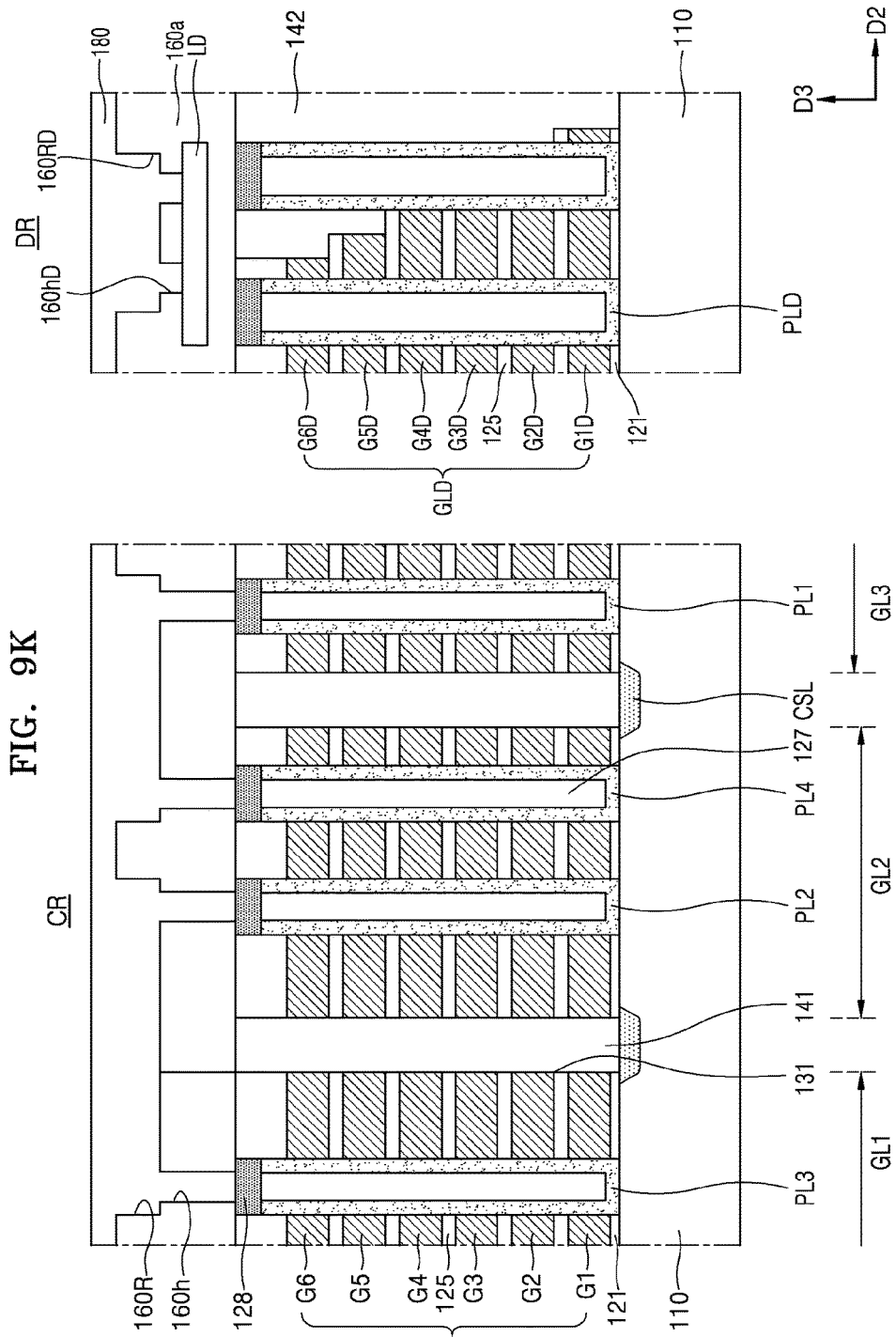

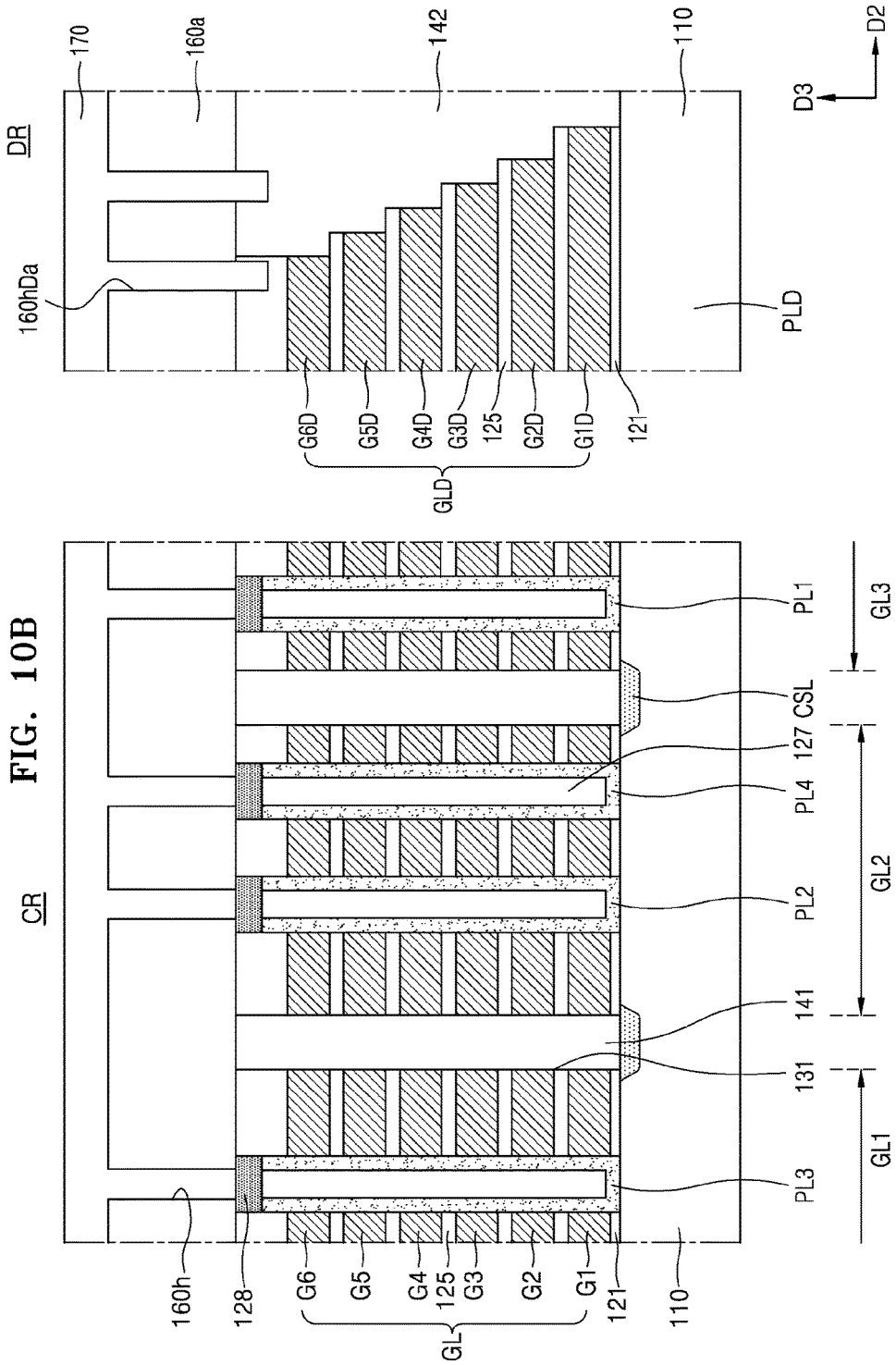

SEMICONDUCTOR MEMORY DEVICE

PRIORITY STATEMENT

This application claims the benefit of Korean Patent Application No. 10-2015-0146661, filed on Oct. 21, 2015, in the Korean Intellectual Property Office, the disclosure of which is incorporated herein in its entirety by reference.

BACKGROUND

The inventive concept relates to a semiconductor memory device. More particularly, the inventive concept relates to a vertical or three-dimensional (3D) semiconductor memory device.

In order for semiconductor devices to offer excellent performance and yet remain low in cost to produce, it is necessary for the semiconductor devices to have a high degree of integration. In particular, the integration degree of a semiconductor memory device is an important factor in determining the price of an electronic product having such a memory. The integration degree of a two-dimensional memory device is mainly a factor of the region occupied by a unit memory cell. Hence, the integration degree of a two-dimensional memory device may be significantly affected by the technical level attainable in a technique of forming a fine pattern.

However, equipment for forming fine patterns is extremely expensive. Furthermore, although the integration degree of two-dimensional memory devices has been increased throughout the years, it is still limited. Therefore, semiconductor memory devices having a three-dimensional structure are being developed to provide memory devices of higher degrees of integration at reasonable costs.

SUMMARY

According to an aspect of the inventive concept, there is provided a semiconductor memory device comprising: a substrate extending in a cell region and a dummy region of the device, a plurality of vertical pillars on the substrate, a plurality of connection lines extending over the vertical pillars, a plurality of lower via plugs on the vertical pillars and connecting the vertical pillars to the connection lines, a dummy connection line at the same level as the connection lines with respect to a main surface of the substrate, and a dummy via plug connected to the dummy connection line at the bottom of the dummy connection line and having a height different than that of each of the lower via plugs, and in which the vertical pillars, the connection lines, and the lower via plugs are situated in the cell region, and the dummy connection line and the dummy via plug are situated in the dummy region.

According to another aspect of the inventive concept, there is provided a semiconductor memory device comprising: a substrate extending in a cell region and a dummy region of the device, a gate structure comprising a plurality of gate electrodes stacked one over another on the substrate in the cell region, a dummy gate structure comprising a plurality of dummy gate electrodes stacked one over another on the substrate in the dummy region, a plurality of vertical pillars coupled to the gate structure, a plurality of connection lines extending over the vertical pillars, a plurality of lower via plugs connecting the vertical pillars to the connection lines, a dummy connection line disposed at the same level as the connection lines with respect to a main surface of the substrate, and a dummy via plug connected to the dummy connection line at the bottom of the dummy connection line, and in which the vertical pillars, the connection lines, and the lower via plugs are situated in the cell region, the dummy connection line and the dummy via plug are situated in the dummy region, and the dummy connection line and the dummy via plug are electrically insulated from the substrate and the dummy gate structure.

According to still another aspect of the inventive concept, there is provided a semiconductor memory device comprising: a substrate, a three-dimensional array of memory cells on the substrate and comprising a stack of electrodes, and pillars extending upright on the substrate and vertically through the stack, an interlayer dielectric layer disposed on the substrate and extending over the three-dimensional array of memory cells, electrically conductive connection lines embedded in the interlayer dielectric layer, lower via plugs extending vertically in the interlayer dielectric layer from bottoms of the connection lines and electrically connecting the vertical pillars to the connection lines, and dummy structure comprising dummy metallization embedded in the interlayer dielectric layer and spanning a region of the interlayer dielectric layer located directly above an outer peripheral side portion of the stack. The dummy metallization is electrically isolated from the array of memory cells in the device.

BRIEF DESCRIPTION OF THE DRAWINGS

The inventive concept will be more clearly understood from the following detailed description taken in conjunction with the accompanying drawings in which:

FIGS. 9A, 9B, 9C, 9D, 9E, 9F, 9G, 9H, 9I, 9J, 9K and 9L are cross-sectional views of a semiconductor memory device during the course of its manufacture and together illustrate an example of a method of manufacturing a semiconductor memory device, according to the inventive concept;

FIGS. 10A to 10B are cross-sectional views of a semiconductor memory device during the course of its manufacture and illustrate another example of a method of manufacturing a semiconductor memory device, according to the inventive concept;

DETAILED DESCRIPTION

Figure 1:
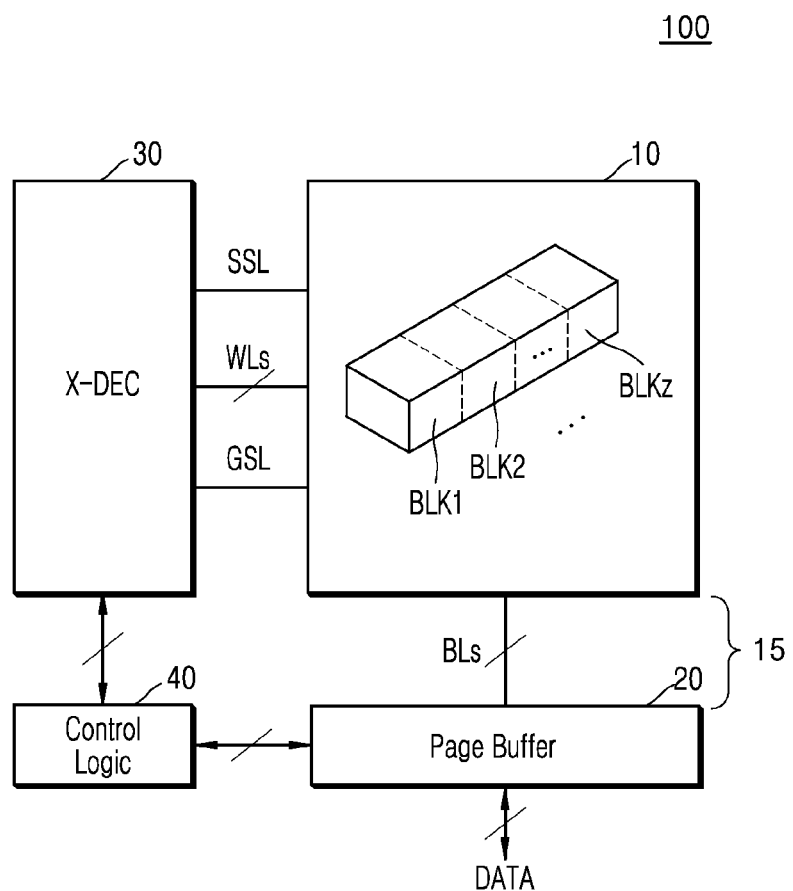
FIG. 1 is a block diagram of a semiconductor memory device, according to an example of the inventive concept.

Hereinafter, examples of the inventive concept will be described with reference to the accompanying drawings. The inventive concept may, however, be exemplified in many different forms and should not be construed as being limited to the examples set forth herein; rather, these example are provided so that this disclosure will be thorough and complete, and will fully convey the inventive concept to those of ordinary skill in the art. It should be understood, however, that there is no intent to limit the inventive concept to the particular examples disclosed, but on the contrary, the inventive concept is to cover various modifications, equivalents, and alternatives as fall within the spirit and scope of the inventive concept. In the drawings, the dimensions of structures are exaggerated for clarity of the inventive concept. As used herein, the term "and/or" includes any and all combinations of one or more of the associated listed items. Expressions such as "at least one of" when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between," versus "directly between," "adjacent," versus "directly adjacent," etc.).

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope of protection of the inventive concept.

The terminology used herein is for the purpose of describing particular example of the inventive concept only and is not intended to be limiting of the inventive concept. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms used in this specification will be construed as general meanings commonly understood by one of ordinary skill in the art and according to context. For example, the term "extending" will generally be understood as referring to a lengthwise or longest dimension of a particular element or feature even if not specified, such as the longitudinal direction of a particular line-shaped conductive line or electrode or the height of a contact extending vertically between two conductive elements. The term "shape" may be understood as referring to the footprint or shape in section of a particular element or feature. The term "height" may be understood as referring to the vertical dimension of a feature or element as measured from the bottom or bottommost part of the feature or element to the top or uppermost part of the feature or element. The term "level" when used to describe the disposition of a surface will generally be understood as referring to the horizontal plane in which the surface lies in the orientation shown in the drawings. On the other hand, the description that two planar elements are disposed at the same "level" in the device will be understood as meaning that at least the bottom surfaces of the elements are coplanar, and may also mean that the top surfaces of the same elements are also coplanar, as the context and figures will make clear. The term "electrically isolated" as used to describe a particular element or feature relative to another will be generally understood as meaning that the element or feature is not disposed in any circuit with the other element or feature. That is, the term "electrically isolated" may be used to describe a characteristic of what is generally referred to in the art as a "dummy" feature.

Hereinafter, examples of the inventive concept will be described in detail with reference to the accompanying drawings.

Figure 2:
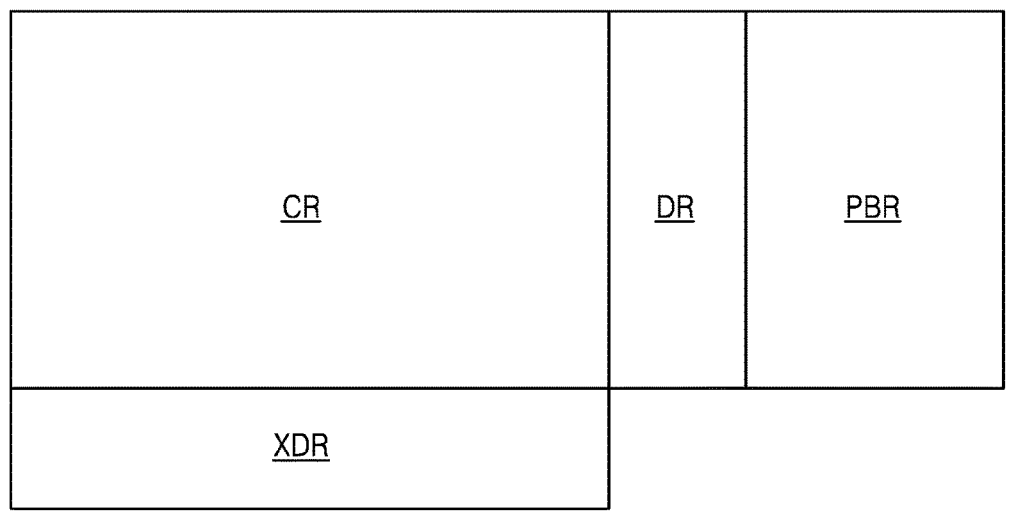
FIG. 2 is a diagram of an arrangement of essential parts of a semiconductor memory device, according to an example of the inventive concept.
Figure 2:
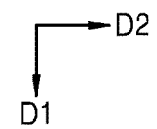

FIG. 1 is a block diagram of a semiconductor memory device 100, according to an example of the inventive concept. FIG. 2 is a diagram of an arrangement of essential parts of the semiconductor memory device 100, according to an example of the inventive concept.

Referring to FIGS. 1 and 2, the semiconductor memory device 100 includes a memory cell array 10, a page buffer circuit 20, an address decoder 30, and a control logic 40.

The memory cell array 10 includes a plurality of memory blocks BLK1 to BLKz (wherein 'z' is an integer of 2 or greater than 2). Each of the memory blocks BLK1 to BLKz may be connected to the address decoder 30 via word lines WLs, at least one string selection line SSL, and at least one ground selection line GSL, and may be connected to the page buffer circuit 20 via bit lines BLs.

The memory blocks BLK1 to BLKz may be arranged over a substrate in a first direction and a second direction that is different from the first direction, and may each include a plurality of 3-dimensional (3D) strings that are arranged in a third direction that is perpendicular to a plane formed in the first and second directions. Each of the strings may include at least one string selection transistor, a plurality of memory cells, and at least one ground selection transistor, which may be provided in series in a direction perpendicular to the substrate. Each of the plurality of memory cells may store one or more bits. According to some example of the inventive concept, at least one dummy cell may be included between the at least one string selection transistor and the plurality of memory cells. According to some example of the inventive concepts, the at least one dummy cell may be included between the plurality of memory cells and the at least one ground selection transistor.

The address decoder (X-DEC) 30 may be connected to the memory cell array 10 via the word lines WLs, the at least one string selection line SSL and the at least one ground selection line GSL. The address decoder 30 may be configured to operate under the control of the control logic 40. The address decoder 30 may receive an address from an external source. The address decoder 30 may decode the address, select a word line corresponding to the decoded address from among the word lines WLs, and select any one of the memory blocks BLK1 to BLKz.

The page buffer circuit 20 is connected to the memory cell array 10 via the bit lines BLs. The page buffer circuit 20 may receive DATA from an external source, and store the DATA in the memory cell array 10. Alternatively, the page buffer circuit 20 may read DATA from the memory cell array 10 and output the DATA to an external source.

The control logic 40 may be connected to the page buffer circuit 20 and the address decoder 30, and control overall operations of the semiconductor memory device 100, such as programming, reading, deleting, etc. The control logic 40 may operate in response to a control signal transmitted from an external source.

The semiconductor memory device 100 may include a cell region CR in which the memory cell array 10 including the plurality of memory blocks BLK1 to BLKz is provided, a page buffer region PBR in which the page buffer circuit 20 is provided, and a decoder region XDR in which the address decoder 30 is provided. The decoder region XDR may be located in a first direction D1 relative to the cell region CR, and the page buffer region PBR may be located in a second direction D2 relative to the cell region CR. That is, the page buffer region PBR and the decoder region XDR may be located in different directions with respect to the cell region CR.

A dummy region DR may be provided between the cell region CR and the page buffer region PBR. That is, the cell region CR, the dummy region DR, and the page buffer region PBR may be sequentially arranged in the second direction D2. The dummy region DR may correspond to a portion 15 of the example of FIG. 1 where the bit lines BLs connect the memory cell array 10 and the page buffer circuit 20. That is, the bit lines BLs may extend from the cell region CR toward the page buffer region PBR.

Figure 3A:
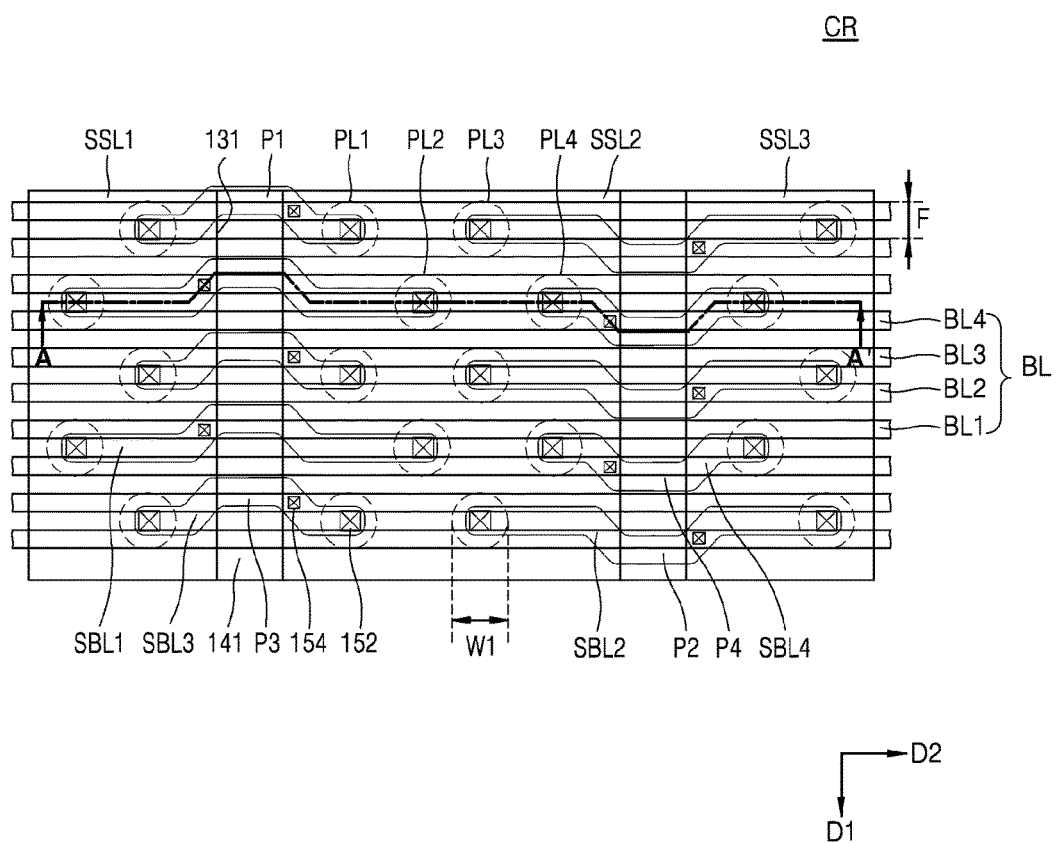
FIG. 3A is a plan view of a memory block included in a cell region of a semiconductor memory device, according to an example of the inventive concept.
Figure 3B:
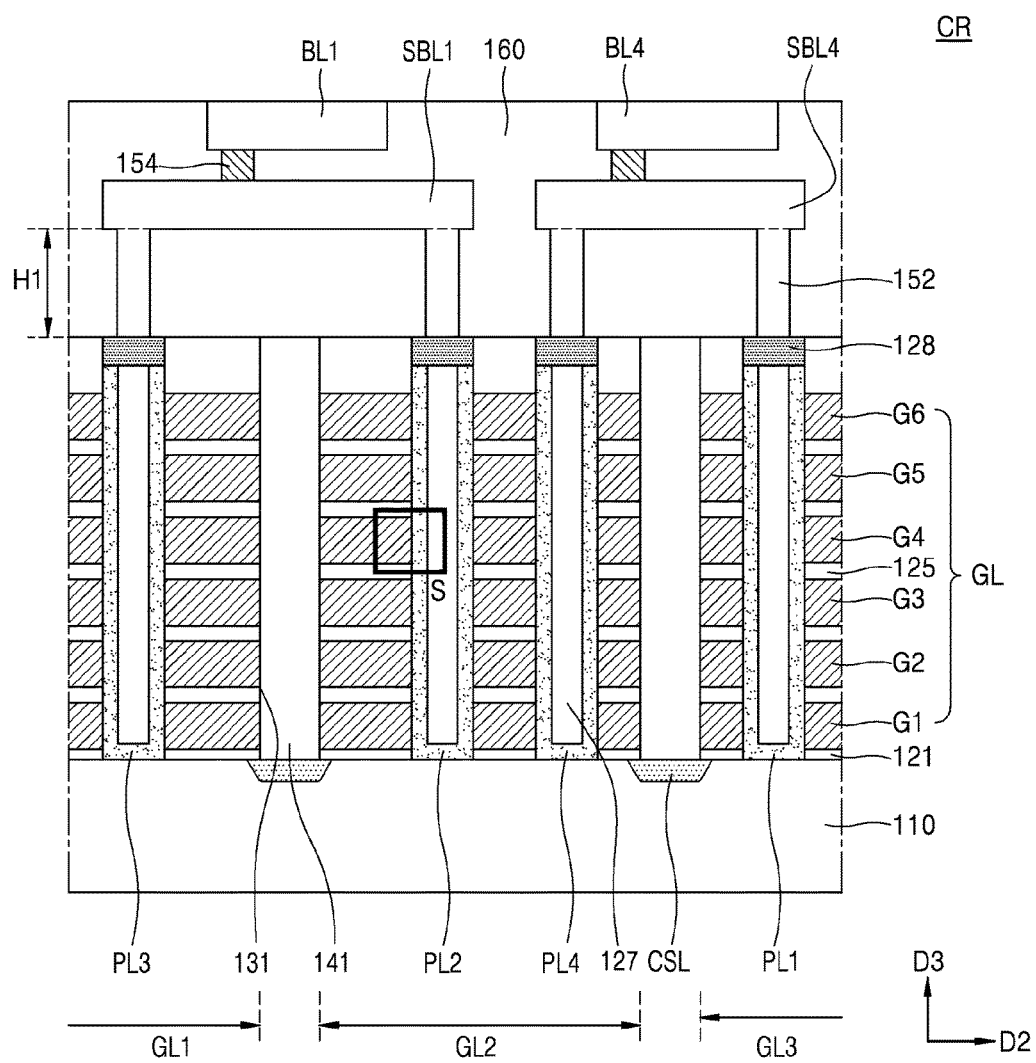
FIG. 3B is a cross-sectional view of the memory block, taken along line A-A' of FIG. 3A.
Figure 3C:
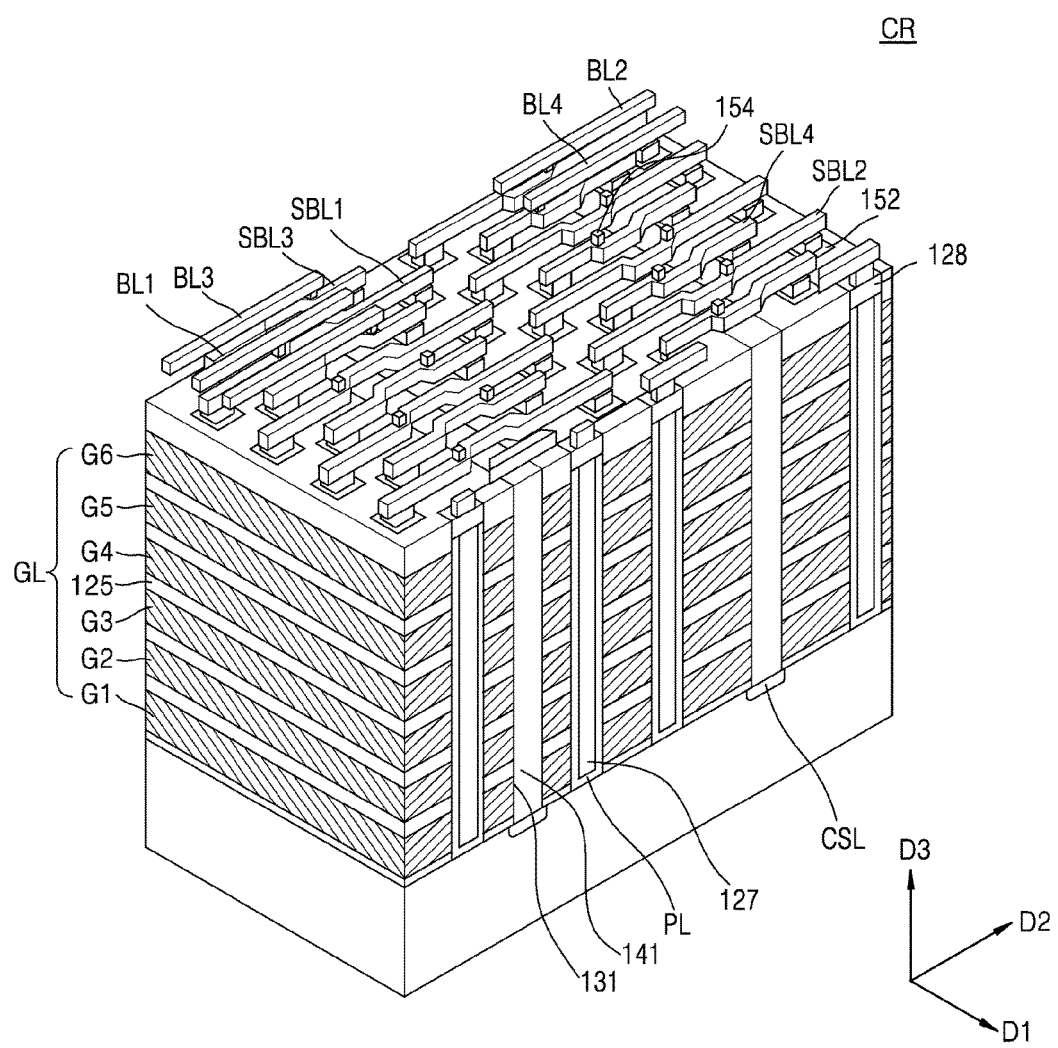
FIG. 3C is a perspective view of the memory block included in the cell region of the semiconductor memory device, according to an example of the inventive concept.

FIG. 3A is a plan view of a memory block included in a cell region CR of a semiconductor memory device, according to an example of the inventive concept. FIG. 3B is a cross-sectional view of the memory block, taken along line A-A' of FIG. 3A. FIG. 3C is a perspective view of the memory block included in the cell region CR of the semiconductor memory device, according to an example of the inventive concept.

Referring to FIGS. 3A to 3C, the cell region CR of the semiconductor memory device may include a substrate 110 and a gate structure GL over the substrate 110.

The substrate 110 may be a substrate of a semiconductor material. The substrate 110 may, for example, be a silicon (Si) substrate. Alternatively, the substrate 110 may include a semiconductor element, such as germanium (Ge), or a compound semiconductor material, such as silicon carbide (SiC), gallium arsenide (GaAs), indium arsenide (InAs), or indium phosphide (InP). As another example, the substrate 110 may be a silicon-on-insulator (SOI) substrate. For example, the substrate 110 may include a buried oxide (BOX) layer. The substrate 110 may include a conductive region, for example, a well doped with an impurity. The substrate 110 may have various device isolation structures, such as a shallow trench isolation (STI) structure or a deep trench isolation (DTI) structure. The substrate 110 may have a first conductivity type, for example, a P type.

A buffer dielectric film 121 may be provided between the substrate 110 and the gate structure GL. The buffer dielectric film 121 may include a silicon oxide, a silicon nitride, a silicon oxynitride, a gallium oxide, a germanium oxide, a high-k dielectric, or any combination thereof.

The gate structure GL may extend in a first direction D1. Two adjacent gate structures GL may face each other in a second direction D2 perpendicular to the first direction D1. The gate structure GL may include a plurality of insulating patterns 125 and a plurality of gate electrodes G1 to G6 spaced apart from one another with the plurality of insulating patterns 125 being provided therebetween. The plurality of gate electrodes G1 to G6 may include first to sixth gate electrodes G1 to G6 sequentially stacked above the substrate 110. The insulating pattern 125 may include a silicon oxide. The buffer dielectric film 121 may be thinner than the insulating pattern 125. The plurality of gate electrodes G1 to G6 may include a doped polysilicon, a metal, a metal nitride, a metal silicide or a combination thereof. Although the number of gate electrodes G1 to G6 is illustrated as being six in FIGS. 3A and 3C, the inventive concept is not limited thereto and the number of the plurality of gate electrodes may be seven or more.

An isolation region 131 extending in the first direction D1 may be provided between the adjacent gate structures GL. The isolation region 131 may be filled with an isolation insulating film 141. Common source lines CSL may be formed in part of an upper portion of the substrate 110 in the isolation region 131. The common source lines CSL may be spaced apart from one another and may extend in the first direction in the substrate 110. The common source lines CSL may have a second conductivity type different from the first conductivity type, for example, an N type. Alternatively, the common source lines CSL may be interposed between the upper surface of the substrate 110 and the first gate electrode G1 and may have a line-shaped pattern extending in the first direction D1.

A plurality of vertical pillars PL connected to the gate structures GL may be provided above the substrate 110. The plurality of vertical pillars PL may be connected to the substrate 110 by passing through the plurality of gate electrodes G1 to G6. The plurality of vertical pillars PL may extend from the substrate 110 in a third direction D3. One end of each vertical pillar PL may be connected to the substrate 110, and the other end may be connected to any one of a plurality of bit lines BL. The vertical pillars P1 may each have a first width W1. The bit lines BL may include first to fourth bit lines BL1, BL2, BL3, and BL4. The first to fourth bit lines BL1, BL2, BL3, and BL4 may be spaced apart from each other by a certain interval and extend in the second direction D2.

Connection lines SBL1, SBL2, SBL3, and SBL4 are provided between the vertical pillars PL and the bit lines BL1, BL2, BL3, and BL4. The vertical pillars PL may be connected to the connection lines SBL1, SBL2, SBL3, and SBL4 through lower via plugs 152. The bit lines BL1, BL2, BL3, and BL4 may be connected to the connection lines SBL1, SBL2, SBL3, and SBL4 through upper via plugs 154. The connection lines SBL1, SBL2, SBL3, and SBL4 may each be connected to the vertical pillars PL of a pair thereof connected to adjacent gate structures GL, by the lower via plugs 152. The connection lines SBL1, SBL2, SBL3, and SBL4 and the corresponding lower via plugs 152 may be integrally formed. The connection lines SBL1, SBL2, SBL3, and SBL4 and the lower via plugs 152 may be formed by, for example, a dual-damascene process.

A plurality of cell strings of the semiconductor memory device may be provided between the bit lines BL1, BL2, BL3, and BL4 and the common source lines CSL. One cell string may include a string selection transistor connected to the bit lines BL1, BL2, BL3, and BL4, a ground selection transistor connected to the common source lines CSL, and a plurality of memory cells provided between the string selection transistor and the ground selection transistor. The string selection transistor, the ground selection transistor, and the plurality of memory cells may be provided in one semiconductor pillar PL. The first gate electrode G1 may be a ground selection line GSL shown in FIG. 1 of the ground selection transistor. The second to fifth gate electrodes G2 to G5 may be cell gates WLs shown in FIG. 1 of the plurality of memory cells. The sixth gate electrode G6 may be a string selection line SSL shown in FIG. 1 of the string selection transistor.

The plurality of gate structures GL may include first to third gate structures GL1, GL2, and GL3 sequentially arranged adjacent to one another. Sixth gate electrodes G6 of the first to third gate structures GL1, GL2, and GL3 may be respectively referred to as first to third string selection lines SSL1, SSL2, and SSL3. The first to third string selection lines SSL1 to SSL3 may be sequentially arranged in the second direction D2.

Information storage elements (not shown) may be provided between the first to sixth gate electrodes G1 to G6 and the vertical pillars PL. Examples of the information storage elements are shown in and will be described later on with reference to FIGS. 4A to 4I.

The vertical pillar PL may be a semiconductor pillar including a semiconductor material. The vertical pillar PL may function as a channel. The vertical pillars PL may be solid-cylindrical pillars or hollow-cylindrical pillars. When the vertical pillars PL are hollow-cylindrical pillars, the vertical pillars PL may be filled with a filling insulating film 127. The filling insulating film 127 may include a silicon oxide film. The filling insulating film 127 may be in direct contact with inner walls of the vertical pillars PL.

The vertical pillars PL and the substrate 110 may be a semiconductor material having a substantially continuous structure. In this case, the vertical pillars PL may be a single-crystalline semiconductor material. Alternatively, the vertical pillars PL and the substrate 110 may be discontinuous so as to have an interface. In this case, the vertical pillars PL may be a semiconductor material having a polycrystalline or amorphous structure. Conductive patterns 128 may be provided at one ends of the vertical pillars PL. The one ends of the vertical pillars PL which be in contact with the conductive patterns 128 may be drain regions.

The plurality of vertical pillars PL may be arranged in a zigzag manner in the first direction D1. Alternatively, the plurality of vertical pillars PL may be arranged in a zigzag manner in the second direction D2. The plurality of vertical pillars PL may include first to fourth pillars PL1 to PL4 sequentially arranged in a zigzag manner in the second direction D2. The first and second vertical pillars PL1 and PL2 may be connected to the gate structures GL1, GL2 and GL3 at first ends of the string selection lines SSL1, SSL2, and SSL3. The third and fourth vertical pillars PL3 and PL4 may be connected to the gate structures GL1, GL2 and GL3 at second ends of the string selection lines SSL1, SSL2, and SSL3.

The first and fourth vertical pillars PL1 and PL4 may be provided in edges of the string selection lines SSL1, SSL2, and SSL3. The second and third vertical pillars PL2 and PL3 may be provided between the first vertical pillar PL1 and the fourth vertical pillar PL4. That is, the first and second vertical pillars PL1 and PL2 may be alternately arranged in a zigzag manner in the first direction D1 at one end of the string selection lines SSL1, SSL2, and SSL3, and the third and fourth vertical pillars PL3 and PL4 may be alternately arranged in a zigzag manner in the first direction D1 at the other end of the string selection lines SSL1, SSL2, and SSL3.

The second vertical pillar PL2 may be offset from the first vertical pillar PL1 in the first direction D1. The fourth vertical pillar PL4 may be offset from the third vertical pillar PL3 in the first direction D1. Two immediately adjacent vertical pillars among the plurality of vertical pillars PL may be spaced apart from each other by two times a pitch F of the plurality of bit lines BL1 to BL4 in the first direction D1. An interval between the first vertical pillar PL1 and the third vertical pillar PL3 may be substantially equal to an interval between the second vertical pillar PL2 and the fourth vertical pillar PL4.

The arrangement of the plurality of vertical pillars PL is not limited to that shown in FIGS. 3A to 3C. In some example of the inventive concepts, the vertical pillars PL may be arranged in a matrix form (i.e., in rows and columns which are not offset).

The plurality of connection lines SBL1 to SBL4 may include first to fourth connection lines SBL1, SBL2, SBL3, and SBL4. The first connection line SBL1 may connect the third vertical pillar PL3 of the first string selection line SSL1 to the second vertical pillar PL2 of the second string selection line SSL2. The second connection line SBL2 may connect the third vertical pillar PL3 of the second string selection line SSL2 to the second vertical pillar PL2 of the third string selection line SSL3. The third connection line SBL3 may connect the fourth vertical pillar PL4 of the first string selection line SSL1 to the first vertical pillar PL1 of the second string selection line SSL2. The fourth connection line SBL4 may connect the fourth vertical pillar PL4 of the second string selection line SSL2 to the first vertical pillar PL1 of the third string selection line SSL3. The first connection line SBL1 and the third connection line SBL3 may be alternately arranged in the first direction D1, and the second connection line SBL2 and the fourth connection line SBL4 may be alternately arranged in the first direction D1. The first connection line SBL1 and the fourth connection line SBL4 may be alternately arranged in the second direction D2, and the second connection line SBL2 and the third connection line SBL3 may be alternately arranged in the second direction D2. The first to fourth connection lines SBL1 to SBL4 may be connected to other bit lines BL1 to BL4 adjacent to one another. For example, the first connection line SBL1 may be connected to the first bit line BL1, the second connection line SBL2 may be connected to the second bit line BL2, the third connection line SBL3 may be connected to the third bit line BL3, and the fourth connection line SBL4 may be connected to the fourth bit line BL4.

Each of the lower via plugs 152 may have a first height H1. The lower via plugs 152 may be provided above the vertical pillars PL1, PL2, PL3, and PL4, and upper via plugs 154 may be provided above the connection lines SBL1, SBL2, SBL3, and SBL4. The upper via plugs 154 above the first and second connection lines SBL1 and SBL3 may be offset from the lower via plugs 152 in a direction opposite to the first direction D1. The upper via plugs 154 above the second and fourth connection lines SBL2 and SBL4 may be offset from the lower via plugs 152 in the first direction D1.

In the present disclosure, the height of a via plug refers to the distance from a lower surface of the via plug to a lower surface of a connection line that is connected to the via plug.

The first and third connection lines SBL1 and SBL3 may extend in the second direction D2, and may be curved and protrude in the direction opposite to the first direction D1. That is, the first and third connection lines SBL1 and SBL3 may have protruding portions P1 and P3 which are curved and protrude in the direction opposite to the first direction D1. The second and fourth connection lines SBL2 and SBL4 may extend in the second direction D2, and may be curved and protrude in the first direction D1. That is, the second and fourth connection lines SBL2 and SBL4 may have protruding portions P2 and P4 which are curved and protrude in the first direction D1. The portion of each of the first to fourth connection lines SBL1, SBL2, SBL3, and SBL4, other than the respective protruding portion P1, P2, P3, and P4, and extending in the second direction D2 may be referred to as the body portion of the connection line.

The protruding portion P1 of the first connection line SBL1 and the protruding portion P3 of the third connection line SBL3 may be arranged in a row in the first direction D1 above the isolation insulating film 141, and the protruding portion P2 of the second connection line SBL2 and the protruding portion P4 of the fourth connection line SBL4 may be arranged in a row in the first direction D1 above the isolation insulating film 141.

The distance over which the first and second connection lines SBL1 and SBL2 extend in the second direction D2 may be larger than the distance over which the third and fourth connection lines SBL3 and SBL4 extend in the second direction D2. Therefore, the first and second connection lines SBL1 and SBL2 may be referred to as long connection lines and the third and fourth connection lines SBL3 and SBL4 may be referred to as short connection lines.

The protrusion distance over which the protruding portions P1, P2, P3, and P4 of the connection lines SBL1, SBL2, SBL3, and SBL4 protrude in the first direction D1 or the direction opposite to the first direction D1 may be larger than the distance by which the upper via plugs 154 are offset from the lower via plugs 152 in the first direction D1 or the direction opposite to the first direction D1. In this case, the protrusion distance refers to the shortest distance from a line which extends in the second direction D2 between both ends of the connection lines SBL1, SBL2, SBL3, and SBL4 to apexes of the protruding portions P1, P2, P3, and P4 of the connection lines SBL1, SBL2, SBL3, and SBL4.

For example, the upper via plugs 154 above the first and second connection lines SBL1 and SBL3 may be offset from the lower via plugs 152 in the direction opposite to the first direction D1 by half the pitch F of the plurality of bit lines BL1 to BL4. The upper via plugs 154 above the second and fourth connection lines SBL2 and SBL4 may be offset from the lower via plugs 152 in the first direction D1 by half the pitch F of the plurality of bit lines BL1 to BL4. The protrusion distance by which the protruding portions P1 and P3 of the first and third connection lines SBL1 and SBL3 protrude in the direction opposite to the first direction D1 may be larger than half the pitch F of the plurality of bit lines BL1 to BL4. The protrusion distance by which the protruding portions P2 and P4 of the second and fourth connection lines SBL2 and SBL4 protrude in the first direction D1 may be greater than half the pitch F of the plurality of bit lines BL1 to BL4.

Also, the protrusion distance by which the protruding portion P1 of the first connection line SBL1 protrudes in the direction opposite to the first direction D1 may be greater than the protrusion distance by which the protruding portion P3 of the third connection line SBL3 protrudes, and the protrusion distance by which the protruding portion P2 of the second connection line SBL2 protrudes in the first direction D1 may be greater than the protrusion distance by which the protruding portion P4 of the fourth connection line SBL4 protrudes.

That is, the protrusion distance by which the protruding portions P1 and P2 of the long connection lines SBL1 and SBL2 protrude in the direction opposite to the first direction D1 or the first direction D1 may be larger than the protrusion distance by which the protruding portions P3 and P4 of the short connection lines SBL3 and SBL4 protrude in the direction opposite to the first direction D1 or the first direction D1. However, the distance by which the upper via plugs 154 above the long connection lines SBL1 and SBL2 are offset from the lower via plugs 152 in the direction opposite to the first direction D1 or the first direction D1 may be substantially equal to the distance by which the upper via plugs 154 above the short connection lines SBL3 and SBL4 are offset from the lower via plugs 152 in the direction opposite to the first direction D1 or the first direction D1.

Respective shapes of the connection lines SBL1, SBL2, SBL3, and SBL4 are not limited to those shown in FIGS. 3A to 3C. The connection lines SBL1, SBL2, SBL3, and SBL4 may have any of various shapes as long as the connection lines connect two vertical pillars PL that are respectively coupled to the two adjacent string selection line SSL. In some examples of the inventive concepts, the connection lines SBL1, SBL2, SBL3, and SBL4 may be convex in the same direction. In some examples of the inventive concepts, some of the connection lines SBL1, SBL2, SBL3, and SBL4 may be convex, and others may have a bar shape, i.e., may be linear. In some examples of the inventive concept, the connection lines SBL1, SBL2, SBL3, and SBL4 may have identical lengths in the second direction D2.

The upper via plugs 154 above the connection lines SBL1 to SBL4 may be closer to one string selection line of adjacent string selection lines SSL1, SSL2, and SSL3 connecting a pair of vertical pillars PL1, PL2, PL3, and PL4 connected by the connection lines SBL1 to SBL4.

The upper via plugs 154 above the first and third connection lines SBL1 and SBL3 may be arranged in a zigzag manner in the first direction D1. The upper via plugs 154 above the second and fourth connection lines SBL2 and SBL4 may be arranged in a zigzag manner in the first direction D1.

For example, the upper via plug 154 above the first connection line SBL1 may be provided adjacent to the first string selection line SSL1, and the upper via plug 154 above the third connection line SBL3 may be provided adjacent to the second string selection line SSL2. Also, the upper via plug 154 above the second connection line SBL2 may be provided adjacent to the third string selection line SSL3, and the upper via plug 154 above the fourth connection line SBL4 may be provided adjacent to the second string selection line SSL2. However, an arrangement of the upper via plugs 154 is not limited thereto. The upper via plug 154 above the first connection line SBL1 may be provided adjacent to the second string selection line SSL2, the upper via plug 154 above the third connection line SBL3 may be provided adjacent to the first string selection line SSL1, the upper via plug 154 above the second connection line SBL2 may be provided adjacent to the second string selection line SSL2, and the upper via plug 154 above the fourth connection line SBL4 may be provided adjacent to the third string selection line SSL3.

The arrangement of the upper via plug 154 is not limited to that shown in FIGS. 3A to 3C. In some examples of the inventive concept, the upper via plugs 154 above the first and third connection lines SBL1 and SBL3 may be arranged in the first direction D1, and the upper via plugs 154 above the second and fourth connection lines SBL2 and SBL4 may be arranged in the first direction D1. For example, the upper via plugs 154 above the first and third connection lines SBL1 and SBL3 may all be adjacent to the first string selection line SSL1, the upper via plugs 154 above the first and third connection lines SBL1 and SBL3 may all be adjacent to the second string selection line SSL2, or the upper via plugs 154 above the first and third connection lines SBL1 and SBL3 may all be arranged in between the first and second string selection lines SSL1 and SSL2. As another example, the upper via plugs 154 above the second and fourth connection lines SBL2 and SBL4 may all be adjacent to the third string selection line SSL3, the upper via plugs 154 above the second and fourth connection lines SBL2 and SBL4 may all be adjacent to the second string selection line SSL2, or the upper via plugs 154 above the first and third connection lines SBL1 and SBL3 may all be arranged between the second and third string selection lines SSL2 and SSL3.

That is, the vertical pillars PL, the connection lines SBL1, SBL2, SBL3, and SBL4, and the upper via plug 154 may maintain a connection relationship in the order of the lower via plug 152, the connection lines SBL1, SBL2, SBL3, and SBL4, and the upper via plug 154 between the vertical pillars PL and the bit lines BL1, BL2, BL3, and BL4, and have various horizontal arrangements.

Inter metal dielectric (IMD) 160 may be provided above the substrate 110 where the vertical pillars PL are provided. The IMD 160 may surround the lower via plug 152, the connection lines SBL1, SBL2, SBL3, and SBL4, and the upper via plug 154. The IMD 160 may have a multi-layer structure that is formed by stacking a plurality of insulating films. The IMD 160 may surround side surfaces and lower surfaces of the bit lines BL1, BL2, BL3, and BL4.

FIGS. 4A to 4I are enlarged views of a region S of FIG. 3B.

Figure 4A:
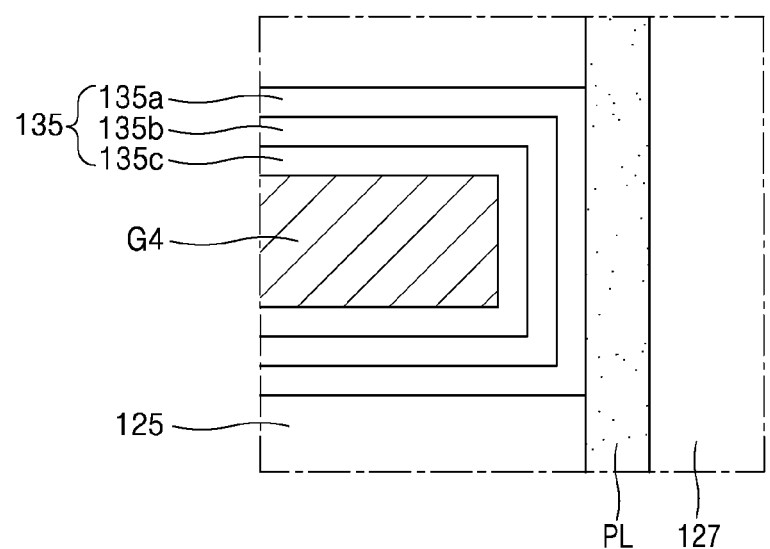
FIGS. 4A, 4B, 4C, 4D, 4E, 4F, 4G, 4H and 4I are enlarged views of a region S of FIG. 3B.

Referring to FIG. 4A, an information storage element 135 may include a blocking insulating film 135c adjacent to the gate electrode G4, a tunnel insulating film 135a adjacent to the vertical pillars PL, and a charge storage film 135b provided between the blocking insulating film 135c and the tunnel insulating film 135a. The information storage elements 135 may extend between the gate electrode G4 and the insulating patterns 125.

The blocking insulating film 135c may include a high-k dielectric film, but is not limited thereto. The blocking insulating film 135c may include at least one high-k dielectric film selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, and lead zinc niobate.

Thus, the blocking insulating film 135c may be a multi-layered film including a plurality of thin films. For example, the blocking insulating film 135c may be a multi-layered film including at least two different thin films selected from the group consisting of an aluminum oxide film, a hafnium oxide film, a hafnium silicon oxide film, a zirconium oxide film, a zirconium silicon oxide film, and a silicon oxide film. The layers constituting the blocking insulating film 135c may be stacked in any of various orders.

The charge storage film 135b may be an insulating film including a charge trapping film or conductive nanoparticles. The charge trapping film may include a material whose dielectric constant is larger than that of a silicon oxide film and is smaller than that of the blocking insulating film 135c. For example, when the dielectric constant of the silicon oxide film is 3.9, the charge trapping film may include a silicon nitride film having a dielectric constant of about 6. The charge trapping film may include a nitride film, such as a silicon nitride film, an aluminum nitride film, or a silicon oxynitride film.

The tunnel insulating film 135a may be a silicon oxide film or an insulating film having a high dielectric constant.

Figure 4B:
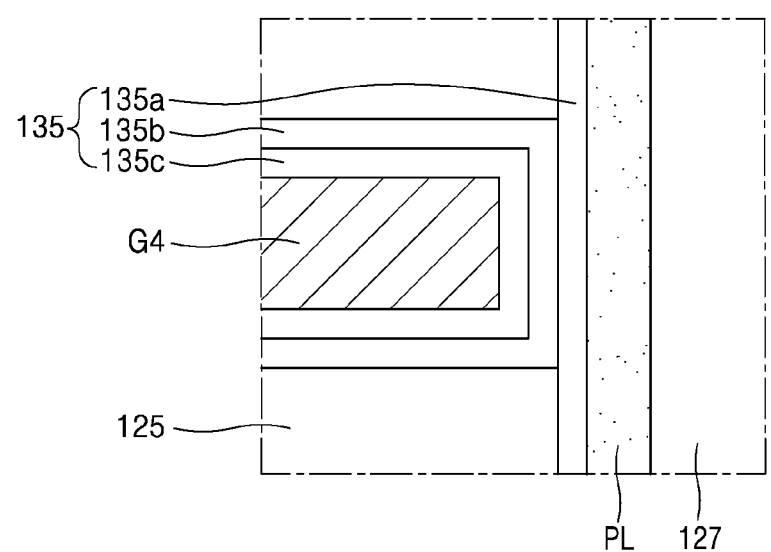
Figure 4C:
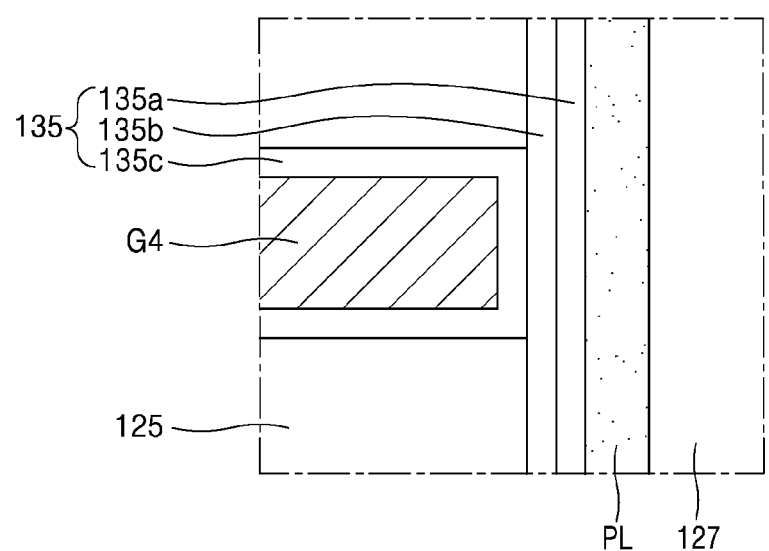
Figure 4D:
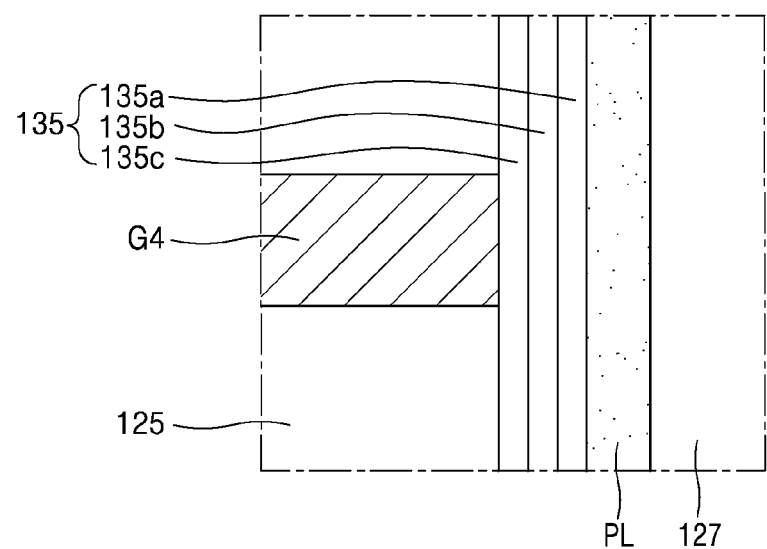

Referring to FIGS. 4B to 4D, at least some of the information storage elements 135 may extend between the insulating patterns 125 and the vertical pillars PL.

Referring to FIG. 4B, the tunnel insulating film 135a may extend between the insulating patterns 125 and the vertical pillars PL, and the charge storage film 135b and the blocking insulating film 135c may extend between the insulating patterns 125 and the gate electrode G4.

Referring to FIG. 4C, the tunnel insulating film 135a and the charge storage film 135b may extend between the insulating patterns 125 and the vertical pillars PL, and the blocking insulating film 135c may extend between the insulating patterns 125 and the gate electrode G4.

Referring to FIG. 4D, the tunnel insulating film 135a, the charge storage film 135b, and the blocking insulating film 135c may extend between the insulating patterns 125 and the vertical pillars PL.

Figure 4E:
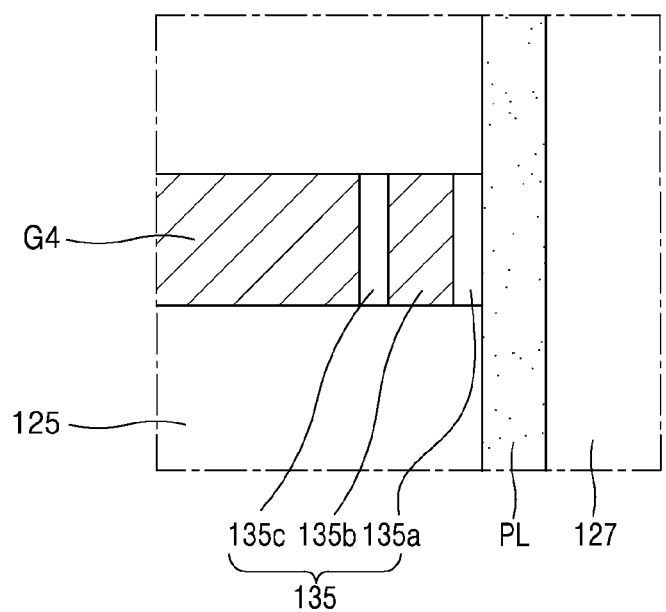

Referring to FIG. 4E, the charge storage film 135b may be a doped polysilicon. In this case, the tunnel insulating film 135a, the charge storage film 135b, and the blocking insulating film 135c may be confined between the gate electrode G4 and the vertical pillars PL. In some examples of the inventive concept, the vertical pillars PL may be conductive pillars. The conductive vertical pillar PL may include at least one of doped polysilicon, metal, conductive metal nitride, silicide, and nanostructures such as carbon nanotubes or graphene.

Figure 4F:
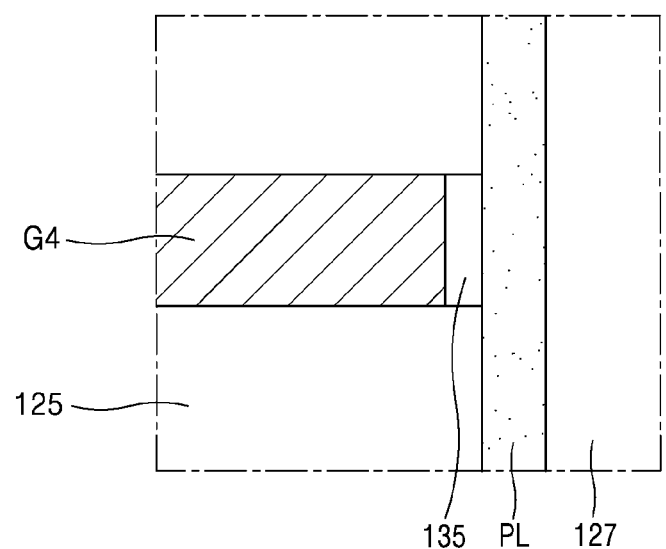
Figure 4G:
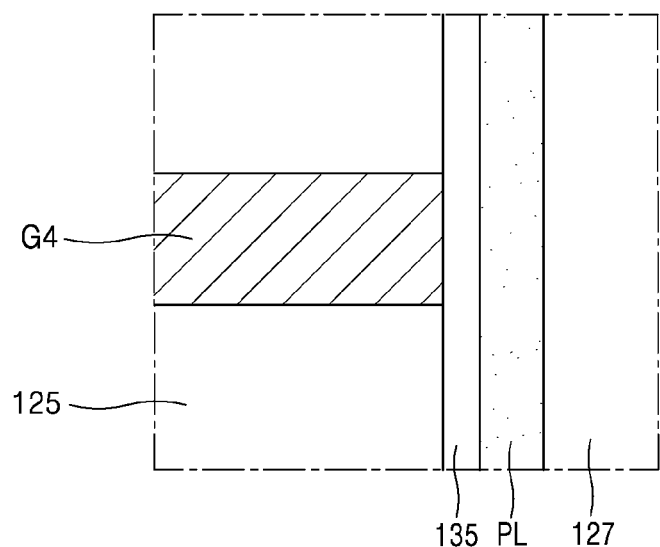
Figure 4H:
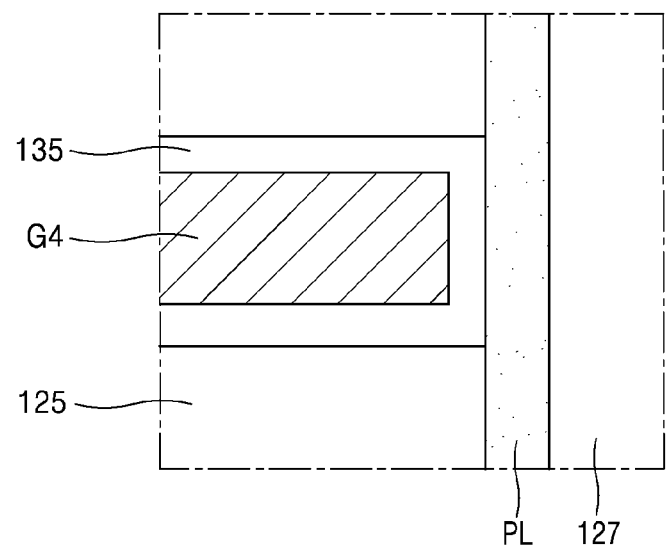

Referring to FIGS. 4F to 4H, the information storage element 135 may be a variable resistance pattern.

Referring to FIG. 4F, the information storage element 135 may be confined between the gate electrode G4 and the vertical pillar PL unlike what is illustrated in FIG. 5.

Referring to FIG. 4G, the information storage element 135 may extend between the insulating patterns 125 and the vertical pillar PL.

Referring to FIG. 4H, the information storage element 135 may extend between the insulating patterns 125 and the gate electrode G4.

In some example of the inventive concepts, the information storage element 135 may include a material whose electrical resistance may be varied depending on heat generated by current passing through its adjacent electrode, for example, a phase change material. The phase change material may include at least one of antimony (Sb), tellurium (Te), and selenium (Se). For example, the phase change material may include a chalcogenide compound in which tellurium (Te) has a concentration of about 20 to about 80 atomic percent, antimony (Sb) has a concentration of about 5 to about 50 atomic percent, and the rest is germanium (Ge). The phase change material may further include at least one element selected from the group consisting of N, O, C, Bi, In, B, Sn, Si, Ti, Al, Ni, Fe, Dy, and La, as an impurity. Alternatively, the information storage element 135 may include one material selected from the group consisting of GeBiTe, InSb, GeSb, and GaSb.

In some examples of the inventive concept, the information storage element 135 may be formed to have a thin film structure having an electrical resistance that may be varied using a spin transfer procedure caused by current passing through the information storage element 135. The information storage element 135 may have a thin film structure to exhibit magnetoresistance characteristics and include, for example, at least one ferromagnetic material and/or at least one of antiferromagnetic material. For example, the information storage element 135 may include a free layer, a pinned layer, and a barrier layer provided between the free layer and the pinned layer.

The free layer may have a magnetization easy axis in a direction perpendicular to a surface of a film forming the free layer and a magnetization direction that varies depending on conditions. The pinned layer may have a magnetization easy axis in a direction perpendicular to a surface of a film forming the pinned layer and a pinned magnetization direction. A resistance value of the information storage element 135 may vary depending on the magnetization direction of the free layer. When the magnetization direction of the free layer is parallel to the magnetization direction of the pinned layer, the information storage element 135 may have a low resistance value and may store data "0". When the magnetization direction of the free layer is antiparallel to the magnetization direction of the pinned layer, the information storage element 135 may have a high resistance value and may store data "1".

Each of the free layer and the pinned layer may have interface perpendicular magnetic anisotropy (IPMA) in an interface with the barrier layer (that is, a contact surface). To this end, the free layer and the pinned layer may include a ferromagnetic material. The ferromagnetic material may have a relatively high magnetic anisotropy energy Ku of, for example, about 106 erg/cc to about 107 erg/cc. The free layer and the pinned layer may have a magnetization easy axis perpendicular to the interface due to the high magnetic anisotropy energy.

The free layer may be a magnetic layer having a variable magnetization direction. That is, the free layer may include a ferroelectric material having a magnetic moment in which a magnetization direction freely varies in a direction perpendicular to a layer surface, for example, at least one selected from the group consisting of Co, Fe and Ni and may further include another element, such as B, Cr, Pt, or Pd. The free layer may be formed of a material different from that of the pinned layer, or may be formed of a material substantially identical to that of the pinned layer. The pinned layer may be a magnetic layer having a pinned magnetization direction. A ferroelectric material forming the pinned layer may include at least one element selected from the group consisting of Co, Fe and Ni and may further include another element, such as B, Cr, Pt, or Pd.

For example, the pinned layer may have a multi-layered structure in which a first layer formed of at least one of Co or a Co alloy and a second layer formed of at least one of Pt, Ni, and Pd are alternately stacked, or may be a FePt layer or CoPt layer having an $L_{10}$ structure or may be a layer of an alloy of a rare-earth element(s) and a transition metal(s). In the case of the latter, the rare-earth element(s) may be at least one of Tb and Gd, and the transition metal(s) may be at least one of Ni, Fe, and Co. Various alloy combinations of the rare-earth element and the transition metal may be used. For example, CoFeB or CoFe may be used as a material of the pinned layer.

The barrier layer may be provided between the free layer and the pinned layer so as to increase a tunnel magnetoresistance ratio (TMR) of the information storage element 135. The barrier layer may have a thickness of about 8 Å to about 15 Å. The barrier layer may have a thickness which is thinner than a spin diffusion distance. The barrier layer may include a nonmagnetic material. The barrier layer may include at least one material selected from the group consisting of an oxide of magnesium (Mg), titanium (Ti), aluminum (Al), magnesium-zinc (MgZn) and magnesium-boron (MgB), and a nitride of titanium (Ti) and vanadium (V). The barrier layer may have, for example, a multi-layered structure.

The free layer, the barrier layer, and the pinned layer may have the same crystalline structure. For example, the free layer, the barrier layer, and the pinned layer may have body centered cubic (BCC) crystalline structures, respectively.

In some examples of the inventive concept, the information storage element 135 may include at least one perovskite compound and/or transition metal oxide. Suitable transition metal oxides may include but are not limited to niobium oxide, titanium oxide, nickel oxide, zirconium oxide, vanadium oxide, PCMO ((Pr,Ca)MnO3), strontium-titanium oxide, barium-strontium-titanium oxide, strontium-zirconium oxide, barium-zirconium oxide, and barium-strontium-zirconium oxide.

Figure 4I:
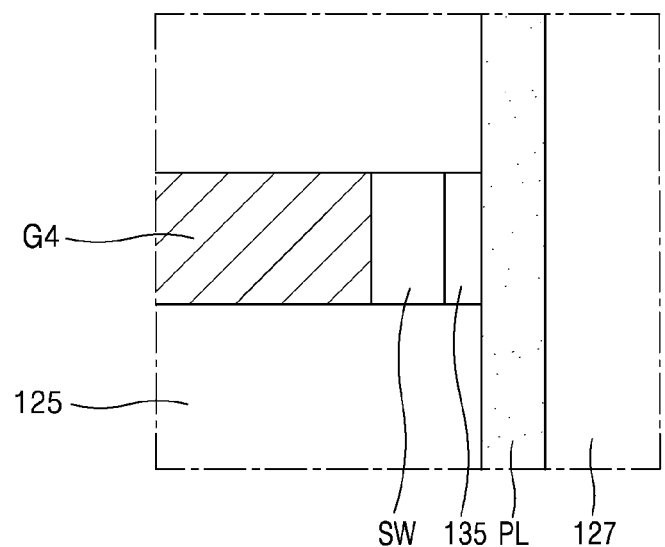

Referring to FIG. 4I, a self-rectifying material SW may be provided between the information storage element 135 and the gate electrode G4. The self-rectifying material SW may have a self-rectifying property like, for example, a PN junction diode. In each of the examples of FIGS. 4E, 4G, and 4H, self-rectifying material SW may be provided between the information storage element 135 and the gate electrode G4.

Specifically, FIGS. 4A to 4I are enlarged views of a portion including the fourth gate electrode G4 among the plurality of gate electrodes G1 to G6 illustrated in FIG. 5, but the features shown in these figures may be applied to the corresponding portions of any one of the first to third gate electrodes G1 to G3, the fifth gate electrode G5, and the sixth gate electrode G6. Alternatively, the features shown in and described with reference to FIG. 4A to 4I may be applied to the corresponding portions of the second gate electrode G2, the third gate electrode G3, and the fifth gate electrode G5 among the plurality of gate electrodes G1 to G6 illustrated in FIG. 5, and a film functioning as a gate dielectric film may be used in the information storage element 135 in the corresponding portions of the first gate electrode G1 and the sixth gate electrode G6.

Figure 5A:
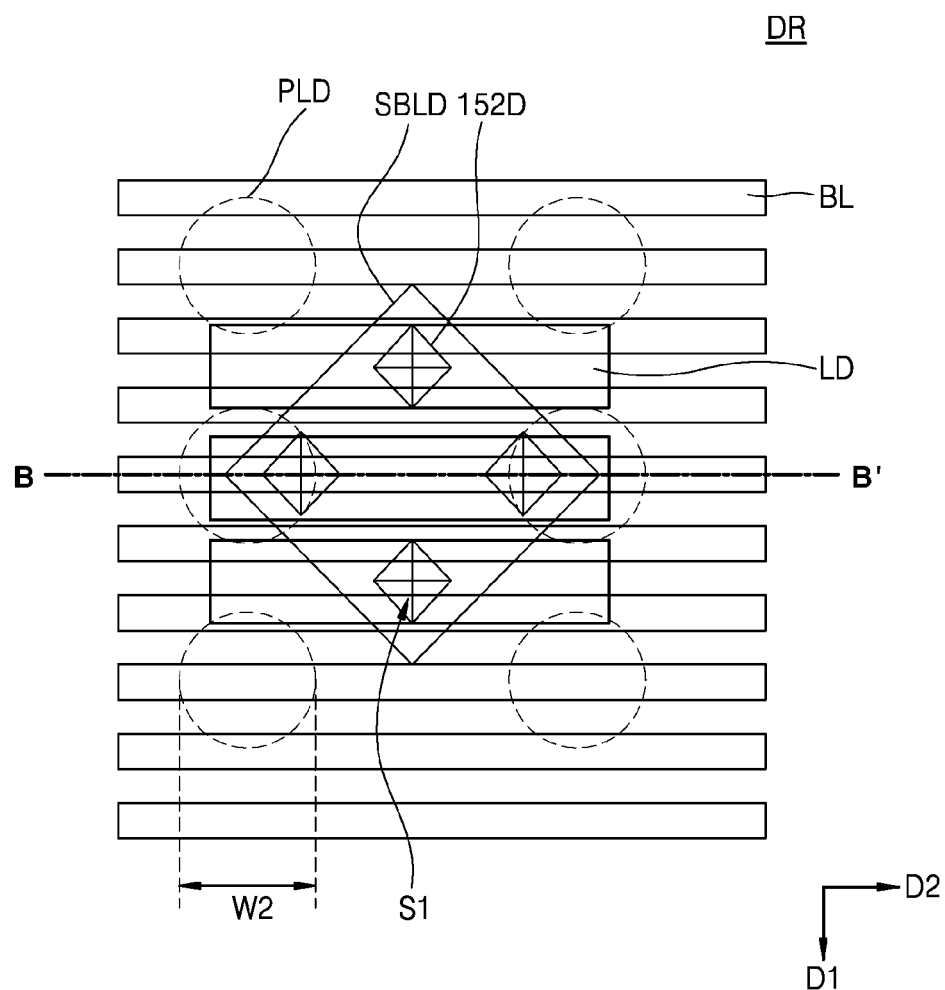
FIG. 5A is a plan view of a dummy region of a semiconductor memory device according to an example of the inventive concept.
Figure 5B:
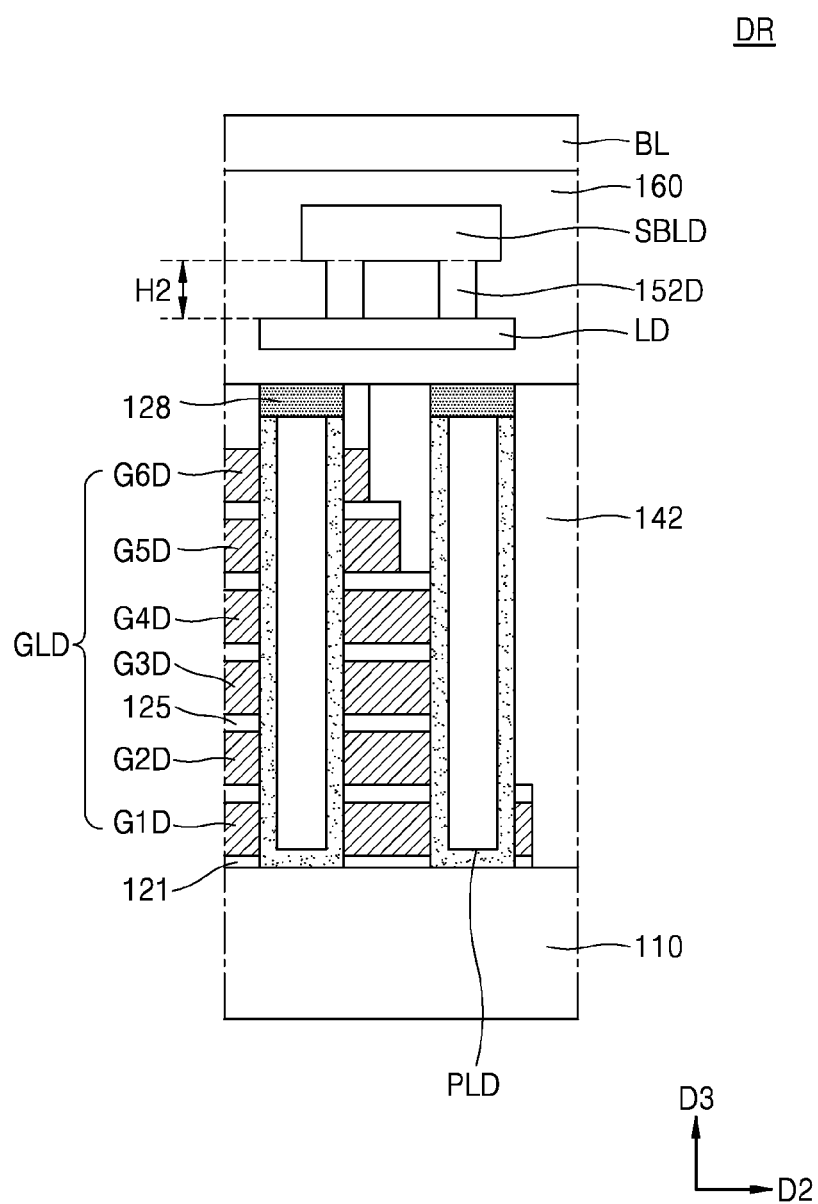
FIG. 5B is a cross-sectional view of the dummy region, taken along line B-B' of FIG. 5A.

FIG. 5A is a plan view of a dummy region DR of a semiconductor memory device according to an example of the inventive concept. FIG. 5B is a cross-sectional view of the dummy region DR, taken along line B-B' of FIG. 5A. That is, an example of dummy structure according to the inventive concept is shown in particular in FIGS. 5A and 5B. Descriptions of other features of the device that have already been described above with reference to FIGS. 3A to 3C may be omitted. Unless otherwise specified, like reference numerals designate like elements.

Referring to FIGS. 5A to 5B, the dummy region DR of the semiconductor memory device includes the substrate 110 and a dummy gate structure GLD above the substrate 110. The buffer dielectric film 121 may be provided between the substrate 110 and the dummy gate structure GLD. The dummy gate structure GLD may include the plurality of insulating patterns 125 and a plurality of dummy gate electrodes G1D to G6D that are spaced apart with the insulating patterns 125 therebetween.

The dummy gate electrodes G1D to G6D may include first to sixth dummy gate electrodes G1D to G6D that are sequentially stacked above the substrate 110. With respect to a main surface of the substrate 110, each of the first to sixth dummy gate electrodes G1D to G6D may be disposed at the same levels as the first to sixth gate electrodes G1 to G6 of the example of FIGS. 3A to 3C, respectively. The first to sixth dummy gate electrodes G1D to G6D may be formed together with the first to sixth gate electrodes G1 to G6. That is, each of the gate electrodes G1 to G6 and each of the dummy gate electrodes G1D to G6D may be a portion of a plurality of gate material layers formed above the substrate 110 in the cell region CR and the dummy region DR the example of FIG. 2.

The first to sixth dummy gate electrodes G1D to G6D may extend to different relative positions in the second direction D2. From among the first to sixth dummy gate electrodes G1D to G6D, a lower dummy gate electrode may extend farther in the second direction D2 than an upper dummy gate electrode. That is, the first dummy gate electrode G1D may have the greatest length in the second direction D2 and the sixth dummy gate electrode G6D may have the smallest length in the second direction D2. Accordingly, the first to sixth dummy gate electrodes G1D to G6D may have the form of stairs at an outer peripheral side of the stack of electrodes.

A plurality of dummy vertical pillars PLD may be provided above the substrate 110 and be coupled to the dummy gate structure GLD. The dummy vertical pillars PLD may be connected to the substrate 110 by penetrating through at least one of the dummy gate electrodes G1D to G6D. The dummy vertical pillars PLD may extend from the substrate 110 in the third direction D3. A conductive pattern 128 may be located at one end of the dummy vertical pillar PLD. One end of the dummy vertical pillar PLD may be connected to the substrate 110 but the other end may not be connected to the bit lines BL. Each of the dummy vertical pillars PLD may have a width W2. The width W2 may be greater than the width W1 of the vertical pillar PL of the example of FIGS. 3A to 3C.

An interlayer insulating layer 142 may be provided between the substrate 110 and the level of an upper surface of the conductive patterns 128. The interlayer insulating layer 142 may surround the dummy gate structure GLD, the dummy vertical pillars PLD, and the conductive patterns 128. In some examples of the inventive concept, the interlayer insulating layer 142 may be formed together with the insulating pattern 125 at the uppermost layer. That is, the interlayer insulating layer 142 may be unitary with the insulating pattern 125.

The bit lines BL may be spaced apart by a certain interval and extend in the second direction D2. The bit lines BL may be the bit lines BL in the cell region CR the example of FIG. 3A that extend to the dummy region DR.

The IMD 160 may be formed above the conductive patterns 128. The IMD 160 may fill a space between the upper surface of the conductive patterns 128 and the bit lines BL, and surround the bit lines BL. The IMD 160 may be formed above the substrate 110 over the cell region CR and the dummy region DR.

A dummy pattern, referred to hereinafter as a "dummy connection line SBLD" may be provided in the IMD 160. The dummy connection line SBLD may be formed together with the connection lines SBL1, SBL2, SBL3, and SBL4 of FIGS. 3A to 3C in the cell region CR. That is, with respect to the main surface of the substrate 110, the dummy connection line SBLD may be provided at a same level as the connection lines SBL1, SBL2, SBL3, and SBL4. The dummy connection line SBLD may have a quadrilateral shape, such as a diamond shape, but is not limited thereto. Also, although FIGS. 5A and 5B show one dummy connection line SBLD, a plurality of dummy connection lines SBLD may be formed and be spaced apart. The connection lines SBL1, SBL2, SBL3, and SBL4 of the cell region CR and the dummy connection lines SBLD of the dummy region DR may be formed by a damascene process that includes Chemical Mechanical Polishing (CMP). Therefore, the size, number, and arrangement of the dummy connection lines SBLD in the dummy region DR may be determined such that a distance between the levels of an upper surface of the connection lines SBL1, SBL2, SBL3, and SBL4 and an upper surface of the dummy connection line SBLD formed by CMP is minimal.

A dummy line pattern LD may be provided under the dummy connection line SBLD in the IMD 160. The dummy line pattern LD may be provided between the dummy vertical pillar PLD and the dummy connection line SBLD. The dummy line pattern LD may be provided between the dummy connection line SBLD and the upper surface of the conductive patterns 128. The dummy line pattern LD may be formed as a line extending in the second direction D2 or a bar with a long axis (i.e., elongated) in the second direction D2.

A dummy via plug 152D may be provided between the dummy line pattern LD and the dummy connection line SBLD, and may connect the dummy line pattern LD and the dummy connection line SBLD. An upper surface of the dummy via plug 152D may contact and be connected to a lower surface of the dummy connection line SBLD. A lower surface of the dummy via plug 152D may contact an upper surface of the dummy line pattern LD. The dummy connection line SBLD and the dummy via plug 152D corresponding thereto may be integrally formed. All portions of the lower surface of the dummy via plug 152D may overlap the upper surface of the dummy line pattern LD. That is, during a process of forming the dummy via plug 152D, the dummy line pattern LD may function as a blocking wall that limits a length by which the dummy via plug 152D extends toward the substrate 110, i.e., a height of the dummy via plug 152D. The dummy connection lines SBLD and the dummy connection plugs 152D and/or the dummy line pattern may constitute metallization embedded in the IMD 160.

The dummy via plug 152D may be formed together with the lower via plug 152 of the example of FIGS. 3A to 3C. The height H2 of the dummy via plug 152D may be smaller than the height H1 of the lower via plug 152 the example of FIG. 3B. That is, with respect to the main surface of the substrate 110, the lower surface of the dummy via plug 152D may be located at a higher level than a lower surface of the lower via plug 152. A horizontal surface of the dummy via plug 152D facing the main surface of the substrate 110 may have a first size S1. The first dummy via plug 152D may be spaced apart from the conductive patterns 128. The lower surface of the dummy via plug 152D may be located at a higher level than the upper surface of the conductive patterns 128, with respect to the main surface of the substrate 110.

A plurality of respective dummy via plugs 152D may be connected to each dummy connection line SBLD, but the inventive concept is not limited thereto. This will be described below with reference to FIGS. 7A to 7C.

The dummy line pattern LD, the dummy via plug 152D, and the dummy connection line SBLD may be buried in the IMD 160. That is, the dummy line pattern LD, the dummy via plug 152D, and the dummy connection line SBLD may be electrically insulated from components that are electrically connected to the substrate 110, and thus electrically float. For example, the dummy line pattern LD, the dummy via plug 152D, and the dummy connection line SBLD may be electrically insulated from the substrate 110, the dummy gate structure GLD, the dummy vertical pillar PLD, and the bit lines BL. For example, the dummy line pattern LD, the dummy via plug 152D, and the dummy connection line SBLD may be electrically insulated from the substrate 110, the gate structure GL, the dummy vertical pillars PLD, the connection lines SBL1, SBL2, SBL3, and SBL4, the lower via plug 152, the upper via plug 154, and the bit lines BL.

Figure 6A:
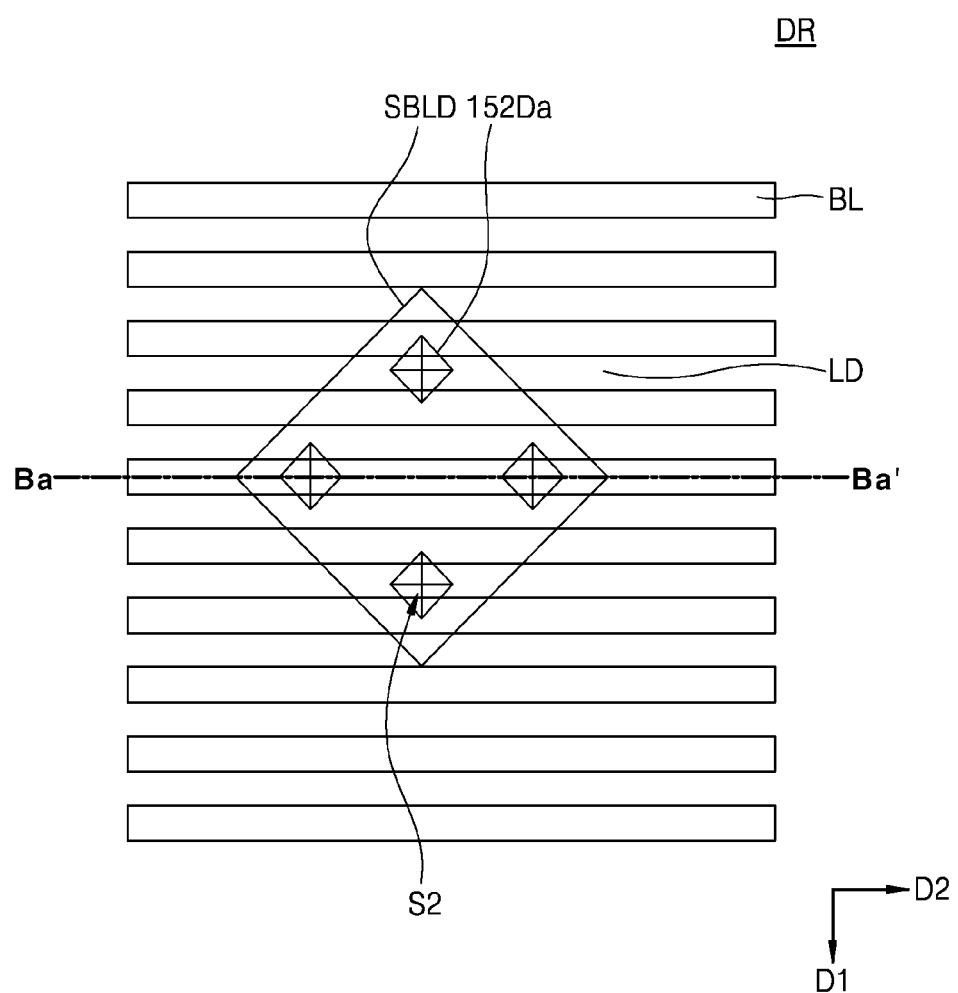
FIG. 6A is a plan view of another dummy region of a semiconductor memory device according to an example of the inventive concept.
Figure 6B:
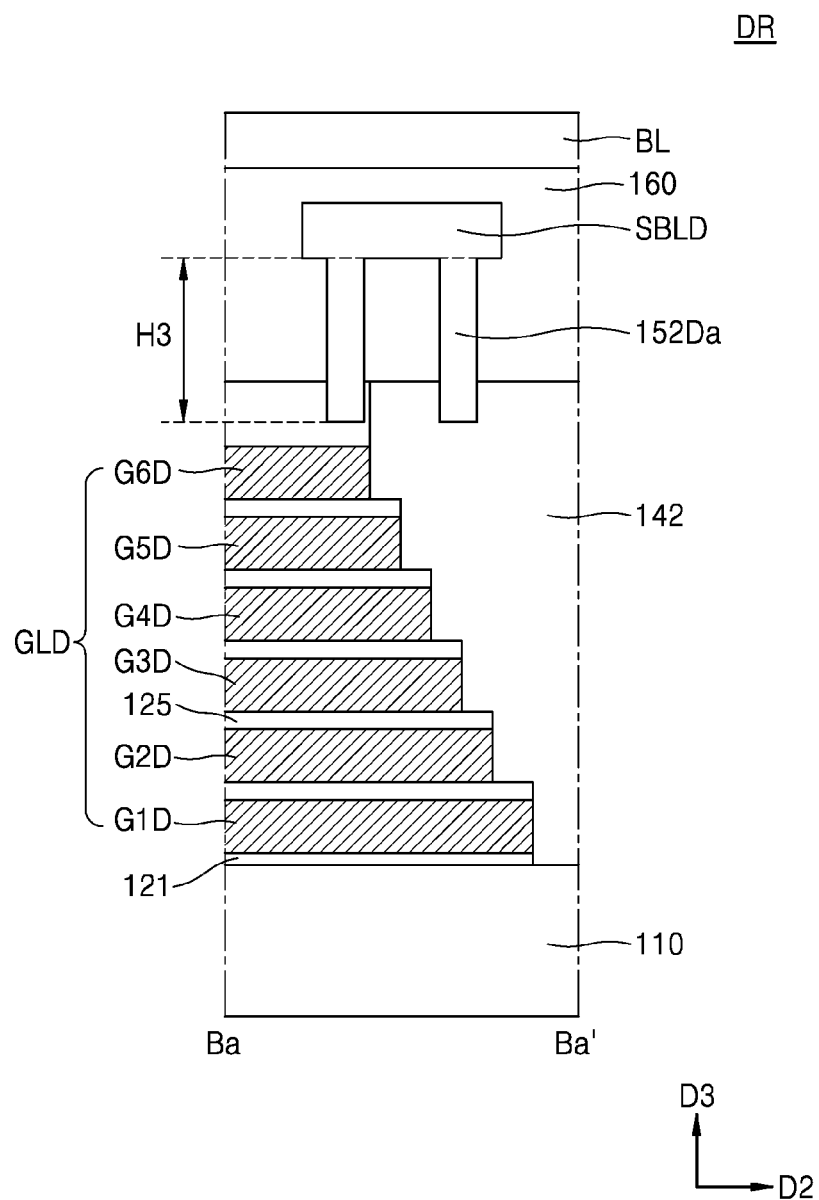
FIG. 6B is a cross-sectional view of the dummy region, taken along line Ba-Ba' of FIG. 6A.

FIG. 6A is a plan view of another example of a dummy region DR of a semiconductor memory device according to the inventive concept. FIG. 6B is a cross-sectional view of the dummy region DR, taken along line Ba-Ba' of FIG. 6A. Detailed descriptions of features of the example of FIGS. 6A and 6B that have already been described above with reference to FIGS. 5A to 5B may be omitted. An example of dummy structure shown in FIGS. 6A and 6B that is different from the example of the dummy structure shown in the example of FIGS. 5A and 5B will be mainly described below.

Referring to FIGS. 6A and 6B, the dummy region DR of the semiconductor memory device includes the substrate 110 and the dummy gate structure GLD provided above the substrate 110.

Unlike the dummy region DR of the example of FIGS. 5A and 5B, the dummy region DR shown in FIGS. 6A and 6B does not include the dummy vertical pillar PLD. Alternatively, FIGS. 6A and 6B may show a portion of the dummy region DR where the dummy vertical pillar PLD is not provided.

The dummy connection line SBLD may be provided in the IMD 160. A dummy via plug 152Da may be provided under the dummy connection line SBLD. An upper surface of the dummy via plug 152Da may contact a lower surface of the dummy connection line SBLD. In this case, the dummy connection line SBLD and/or the dummy via plug 152Da may constitute metallization embedded in the IMD 160. The dummy connection line SBLD and the dummy via plug 152Da corresponding thereto may be integrally formed. In some example of the inventive concepts, the dummy via plug 152Da may extend below a lower surface of the IMD 160. In some examples of the inventive concept, the dummy via plug 152Da may extend into the interlayer insulating layer 142. A lower surface of the dummy via plug 152Da may be spaced apart from the dummy gate electrodes G1D to G6D. That is, the lower surface of the dummy via plug 152Da may be located at a higher level than the uppermost surface of the dummy gate electrodes G1D to G6D, i.e., an upper surface of the sixth dummy gate electrode G6D, with respect to the main surface of the substrate 110.

The height H3 of the dummy via plug 152Da may be greater than the height H2 of the dummy via plug 152D the example of FIG. 5B. That is, the lower surface of the dummy via plug 152Da may be disposed at a level lower than that of the lower surface of the lower via plug 152 with respect to the main surface of the substrate 110. The size S2 of a horizontal surface of the dummy via plug 152Da, i.e., the footprint of the dummy via plug 152Da, may be smaller than the size S1 of a horizontal surface of the dummy via plug 152D the example of FIG. 5A.

A plurality of respective dummy via plugs 152Da may be connected to each dummy connection line SBLD, but the inventive concept is not limited thereto. This will be described below with reference to FIGS. 7A to 7C.

The dummy via plug 152D of the example of FIGS. 5A and 5B may be formed in one portion of the dummy region DR, and the dummy via plug 152Da of the example of FIGS. 6A and 6B may be formed in another portion of the dummy region DR. In this case, when the same numbers of the dummy via plug 152D and the dummy via plug 152Da are provided in a unit area, the height H3 of the dummy via plug 152Da may be greater than the height H2 of the dummy via plug 152D. Also, the size S2 of the dummy via plug 152Da may be smaller than the size S1 of the dummy via plug 152D so that the volume of the dummy via plugs 152D which are in the unit area is the same as or similar to the volume of the dummy via plugs 152Da which are in the unit area.

The dummy via plug 152Da and the dummy connection line SBLD may be buried in the IMD 160. That is, the dummy via plug 152Da and the dummy connection line SBLD may be electrically insulated from the components electrically connected to the substrate 110 and thus electrically float.

Figure 7A:
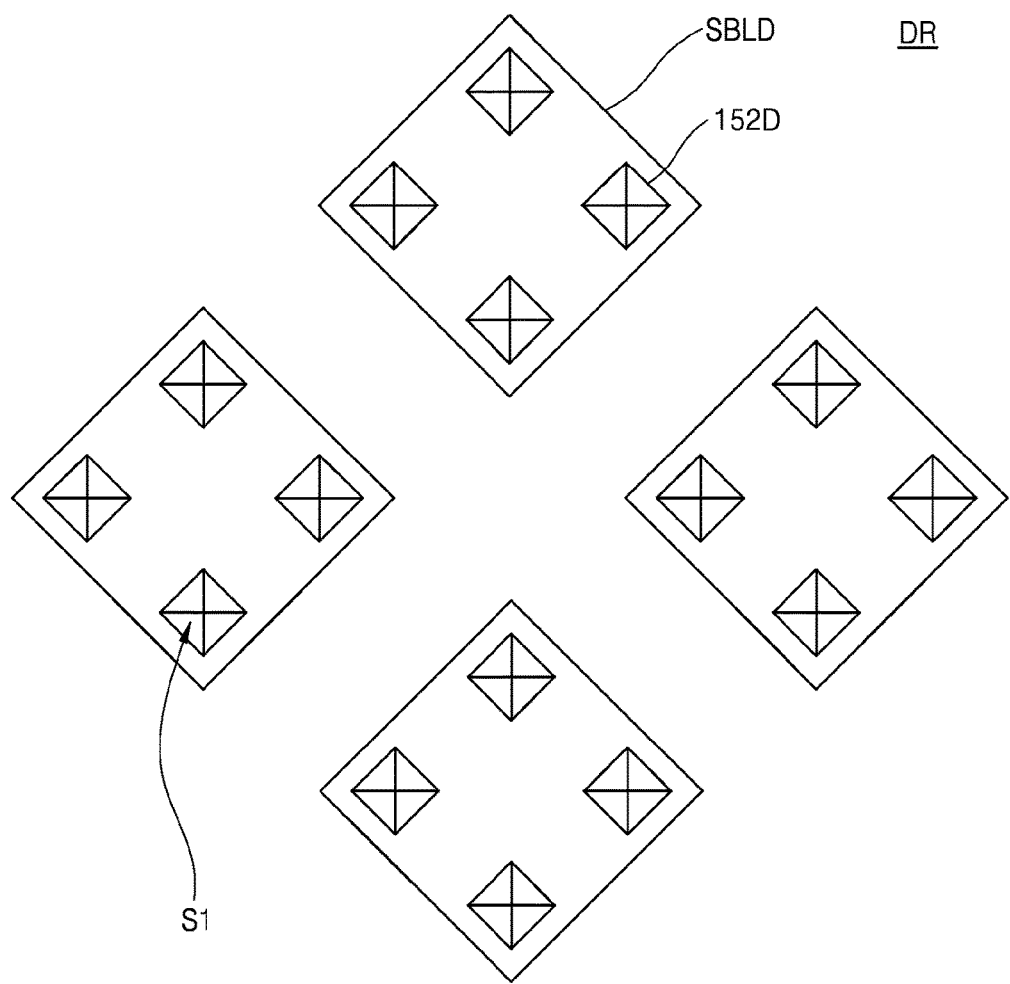
FIGS. 7A, 7B and 7C are plan views of examples of a dummy connection line and a dummy via plug of a semiconductor memory device, according to the inventive concept.
Figure 7B:
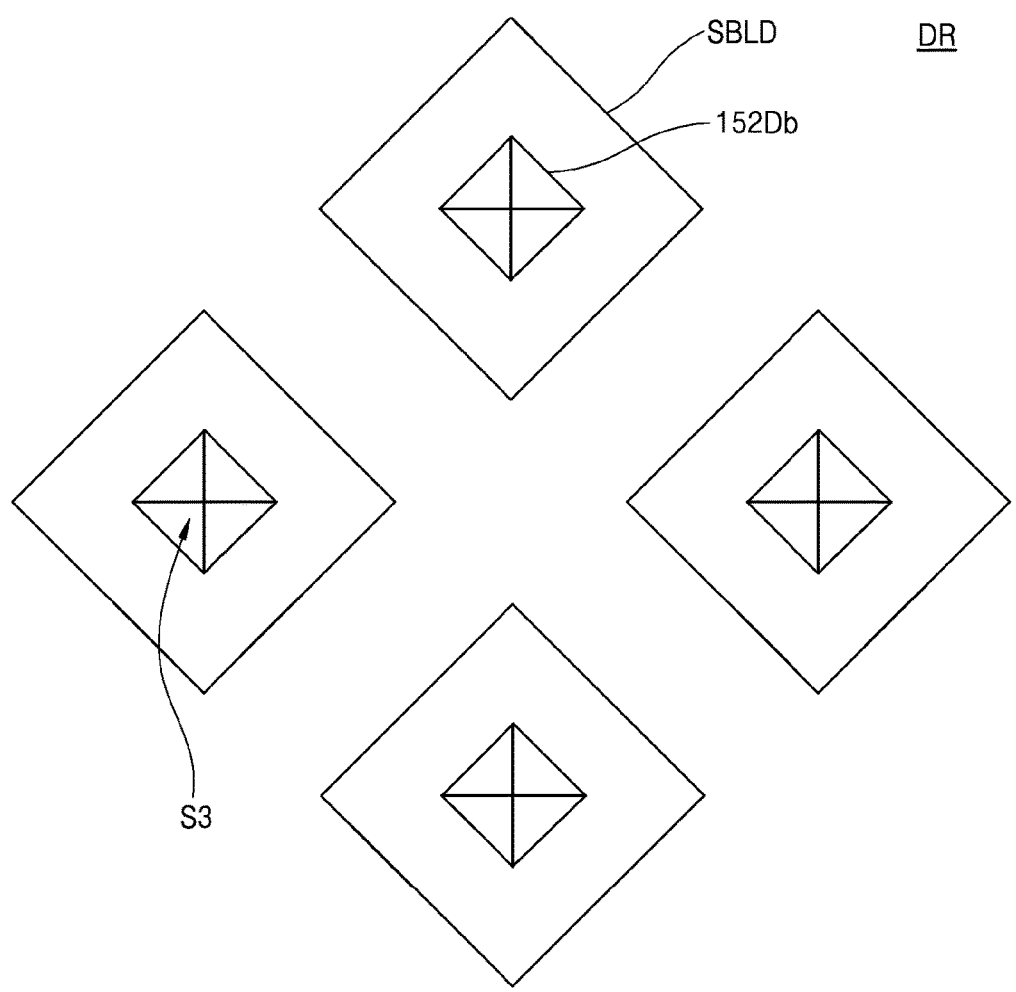
Figure 7C:
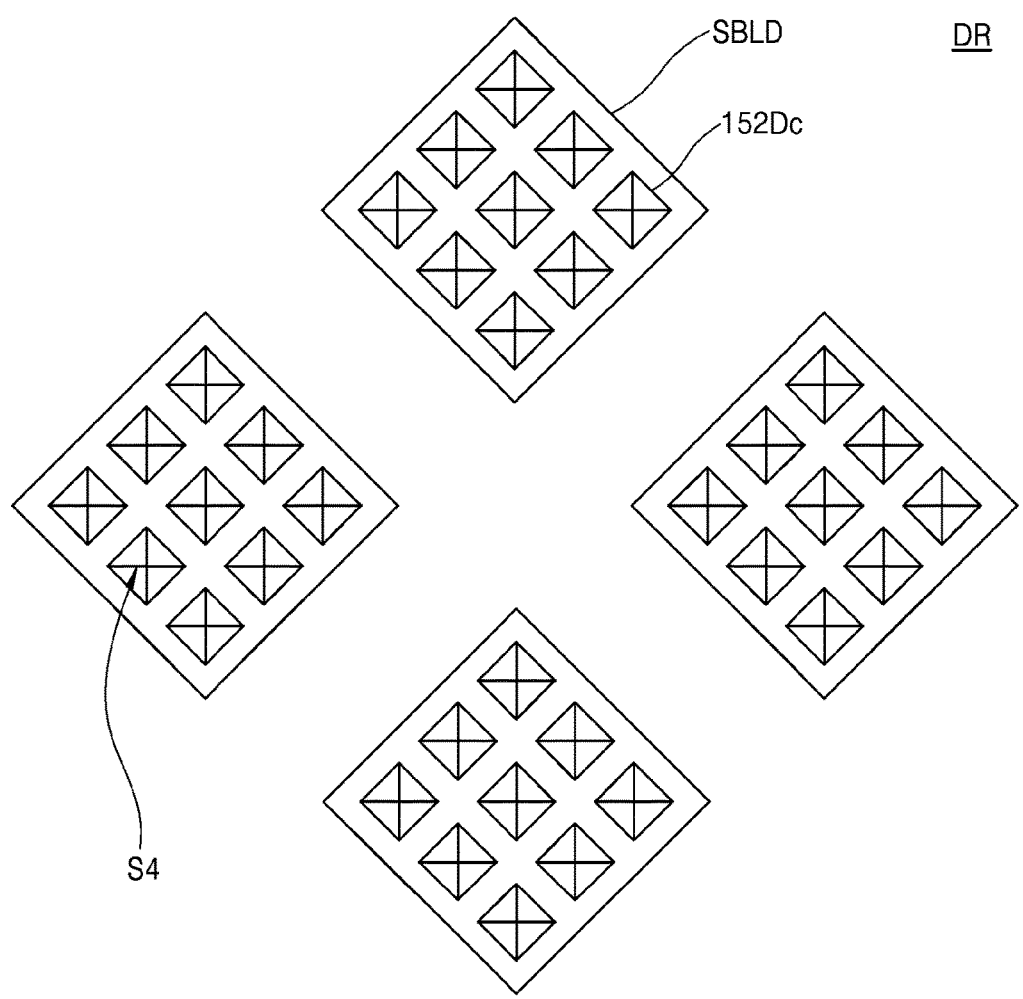

FIGS. 7A to 7C are planar arrangement views of a dummy connection line and a dummy via plug of a semiconductor memory device, according to examples of the inventive concept.

Referring to FIG. 7A, four dummy via plugs 152D may be connected to each of the dummy connection lines SBLD. A horizontal surface of the dummy via plug 152D facing the main surface of the substrate 110 may have a first size S1.

Referring to FIG. 7B, only one respective dummy via plug 152Db may be connected to each of the dummy connection lines SBLD. A horizontal surface of the dummy via plug 152Db facing the main surface of the substrate 110 may have a size S3.

Referring to FIG. 7C, nine dummy via plugs 152Dc may be connected to each of the dummy connection lines SBLD. A horizontal surface of the dummy via plug 152Dc facing the main surface of the substrate 110 may have a size S4.

Referring to FIGS. 7A to 7C, the size S1 may be smaller than the size S3 but greater than the size S4. That is, the size S3 may be the largest, and the size S4 may be the smallest.

In FIGS. 7A to 7C, the numbers of the dummy via plugs 152D, 125Db, and 152Dc that are connected to the dummy connection line SBLD are only illustrated to describe a relative difference between the numbers. The arrangement (number, relative size, shape, etc.) of the dummy via plugs are not limited to any of those shown in FIGS. 7A to 7C.

When there are relatively large numbers of the dummy via plugs 152D, 152Db, and 152Dc connected to the dummy connection line SBLD, a horizontal size may be may be relatively small, and when there are relatively small numbers thereof, the horizontal size may be relatively large. Therefore, regardless of the number of dummy via plugs 152D, 152Db, and 152Dc connected to the dummy connection line SBLD, the dummy via plugs 152D, 152Db, and 152Dc may be designed such that the dummy via plugs 152D, 152Db, and 152Dc occupy regions of similar volumes above a given horizontal plane.

Figure 8A:
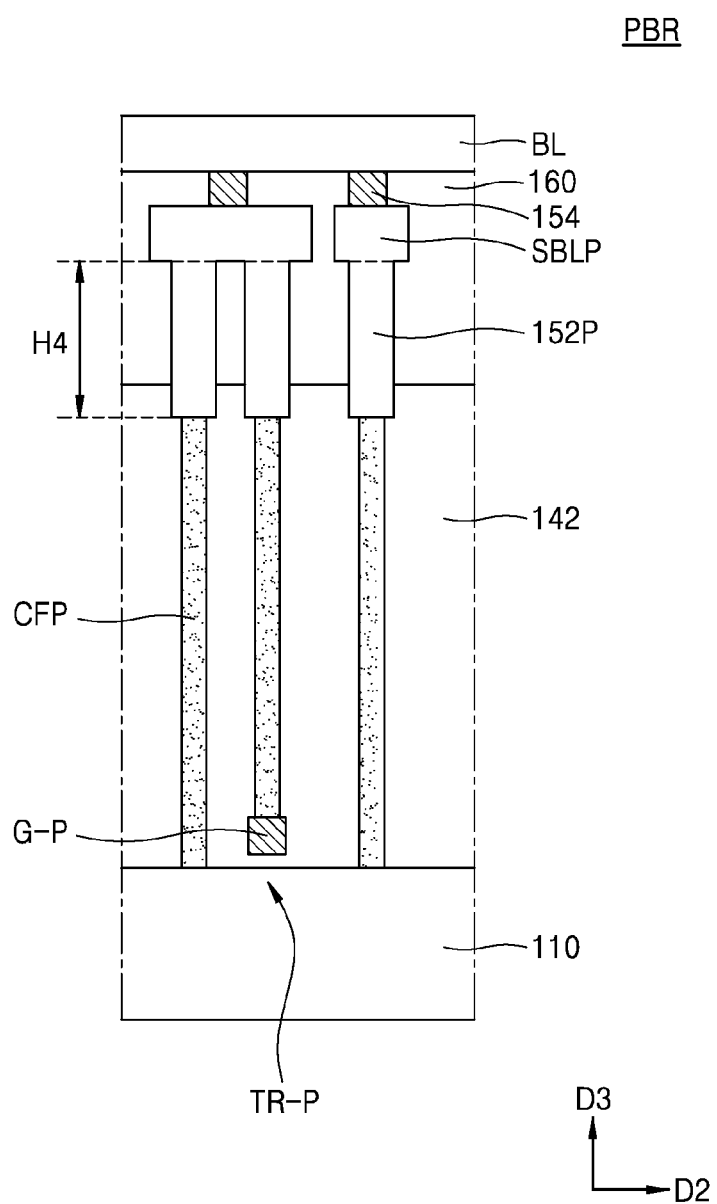
FIGS. 8A and 8B are cross-sectional views of a page buffer region and a decoder region of a semiconductor memory device, according to an example of the inventive concept.
Figure 8B:
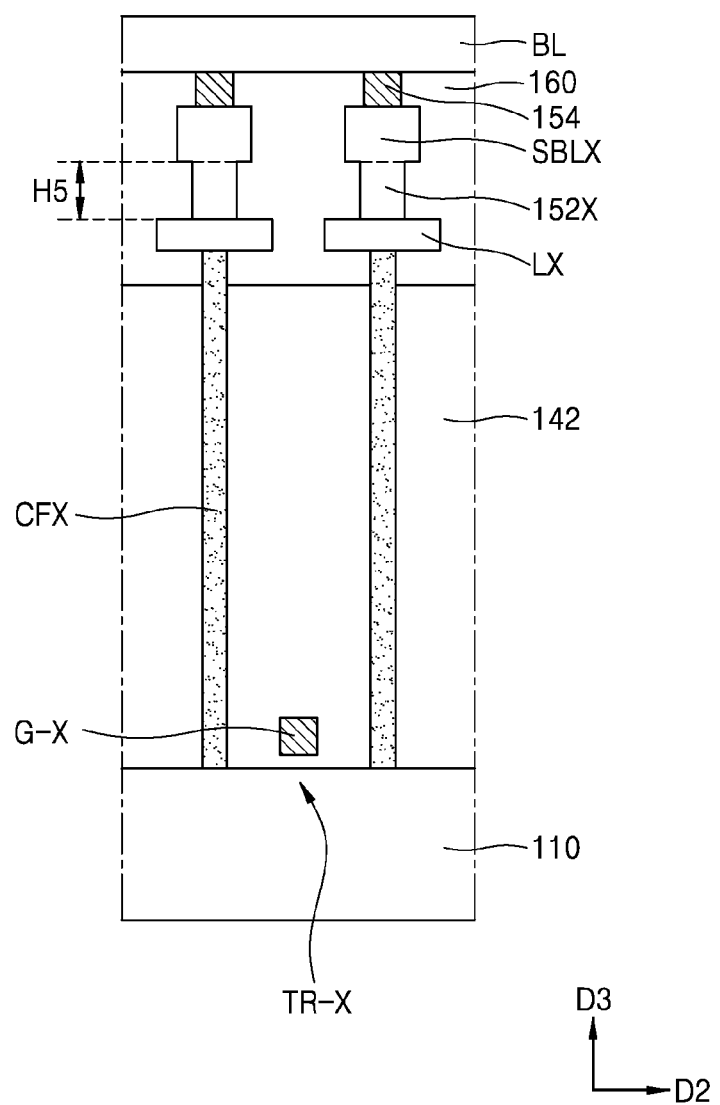

FIGS. 8A and 8B are cross-sectional views of a page buffer region and a decoder region of a semiconductor memory device, according to an example of the inventive concept. Features of the example of FIGS. 8A and 8B that have already described with reference to FIGS. 3A to 7C may be omitted. Unless otherwise specified, like reference numerals designate like elements.

Referring to FIG. 8A, the page buffer region PBR of the semiconductor memory device may include the substrate 110 and a first gate electrode layer G-P above the substrate 110. The first gate electrode layer G-P may constitute a first transistor TR-P in the page buffer region PBR. The interlayer insulating layer 142 and the IMD 160 are stacked above the substrate 110.

A first connection line SBLP may be provided in the IMD 160. The first connection line SBLP may be formed together with the connection lines SBL1, SBL2, SBL3, and SBL4 in the cell region CR shown in FIGS. 3A to 3C and the dummy connection line SBLD in the dummy region DR shown in FIGS. 5A to 6B.

A first via plug 152P may be formed under the first connection line SBLP. An upper surface of the first via plug 152P may contact a lower surface of the first connection line SBLP. The first connection line SBLP and the first via plug 152P corresponding thereto may be integrally formed. In some examples of the inventive concept, the first via plug 152P may extend below the lower surface of the IMD 160. In some examples of the inventive concept, the first via plug 152P may extend into the interlayer insulating layer 142. The first via plug 152P may be formed together with the lower via plug 152 of the example of FIGS. 3A to 3C, the dummy via plug 152D of the example of FIGS. 5A and 5B, and/or the dummy via plug 152Da of the example of FIGS. 6A and 6B.

The height H4 of the first via plug 152P may be equal to the height H3 of the dummy via plug 152Da the example of FIG. 6B.

The bit lines BL may extend in the second direction D2. The bit lines BL may be parts of the bit lines BL in the cell region CR the example of FIG. 3A that extend over the dummy region DR of the examples of FIGS. 5A to 6B to the page buffer region PBR. The bit lines BL may be spaced apart by a certain distance as shown in FIG. 5A or FIG. 6A, and extend in the second direction D2. The bit lines BL may be connected to the first connection line SBLP via the upper via plug 154.

A first contact plug CFP may be provided between the first via plug 152P and the substrate 110 and/or between the first via plug 152P and the first gate electrode layer G-P. The bit lines BL may be electrically connected to the first transistor TR-P via the first contact plug CFP. The first contact plug CFP may electrically connect the first via plug 152P to the substrate 110 and/or electrically connect the first via plug 152P to the first gate electrode layer G-P, and thus form a page buffer circuit with the first transistor TR-P in the page buffer region PBR.

Referring to FIG. 8B, the decoder region XDR of the semiconductor memory device includes the substrate 110 and a second gate electrode layer G-X above the substrate 110. The second gate electrode layer G-X may constitute a second transistor TR-X in the decoder region XDR. The interlayer insulating layer 142 and the IMD 160 are stacked above the substrate 110.

The second connection line SBLX may be provided in the IMD 160. The second connection line SBLX may be formed together with the connection lines SBL1, SBL2, SBL3, and SBL4 in the cell region CR of the example of FIGS. 3A to 3C, the dummy connection line SBLD in the dummy region DR of the example of the examples of FIGS. 5A to 6B, and the first connection line SBLP in the page buffer region PBR of the example of FIG. 8A.

A line pattern LX may be provided in the IMD 160, under the second connection line SBLX. The line pattern LX may be formed as a line extending in the second direction D2 or a bar with a long axis in the second direction D2. The line pattern LX may be formed together with the dummy line pattern LD of the example of FIGS. 5A and 5B.

A second via plug 152X may be formed between the line pattern LX and the second connection line SBLX, and connect the line pattern LX and the second connection line SBLX. An upper surface of the second via plug 152X may contact a lower surface of the second connection line SBLX. The lower surface of the second via plug 152X may contact an upper surface of the line pattern LX. The second connection line SBLX and the second via plug 152X corresponding thereto may be integrally formed. The second via plug 152X may be formed together with the lower via plug 152 of the example of FIGS. 3A to 3C, the dummy via plug 152D of the example of FIGS. 5A and 5B, the dummy via plug 152Da of the example of FIGS. 6A and 6B, and/or the first via plug 152P the example of FIG. 8A.

The height H5 of the second via plug 152X may be equal to the height H2 of the dummy via plug 152D the example of FIG. 5B.

The bit lines BL may extend in the second direction D2. The bit lines BL and the second connection line SBLX may be connected to each other via the upper via plug 154.

A second contact plug CFX may be formed between the second via plug 152X and the substrate 110. The second contact plug CFX may electrically connect the second via plug 152X to the substrate 110, and thus form an address decoder with the second transistor TR-X in the decoder region XDR.

Referring to FIGS. 2, 3A to 3C, 5A and 5B, 6A and 6B, and 8A and 8B, the connection lines SBL1, SBL2, SBL3, and SBL4, the first connection line SBLP, the second connection line SBLX, the lower via plug 152, the first via plug 152P, and the second via plug 152X may be formed by dual-damascene processing in which a metal material layer is formed in a recess in IMD. The dummy via plugs 152D and 152Da may be formed in the dummy region DR so as to reduce a step difference formed by respective upper surfaces of supporting layers that form the recess between the IMD. Also, the dummy connection line SBLD and a dummy connection line SBLDa may be formed in the dummy region DR to reduce a step difference between respective upper surfaces of the metal material layers during CMP of the dual-damascene process.

Although not illustrated, the dummy via plugs 152D and 152Da and the dummy connection lines SBLD and SBLDa may also be formed in the cell region CR, the page buffer region PBR, and/or the decoder region XDR, and thus reduce a step difference between the respective upper surfaces of the supporting layer and the metal material layers. During this process, the dummy line pattern LD may function as a blocking wall that selectively limits a height of the dummy via plug 152D.

The dummy via plugs 152D and 152Da and the dummy connection lines SBLD and SBLDa may be buried in the IMD 160, be electrically insulated from the components that are electrically connected to the substrate 110, and thus electrically float. Therefore, the dummy via plugs 152D and 152Da and the dummy connection lines SBLD and SBLDa may minimize a step difference between various regions and increase precision of photo-processing during the manufacturing of the semiconductor memory device 100, while not affecting electrical properties of the semiconductor memory device 100. Accordingly, a semiconductor memory device with increased integration degree and improved reliability may be manufactured.

FIGS. 9A to 9L are cross-sectional views illustrating a method of manufacturing a semiconductor memory device, according to an example of the inventive concept. With reference to FIGS. 9A to 9L, the manufacturing method will be described mainly in connection with the cell region CR and the dummy region DR of the semiconductor memory device 100 shown in FIG. 2. Descriptions of features that have been described above with reference to FIGS. 1 to 8B may be omitted. In particular, with reference to FIGS. 9A to 9L, a method of manufacturing the cell region CR of the example of FIGS. 3A to 3C and the dummy region DR of the example of FIGS. 5A and 5B will be described.

From among components in the page buffer region PBR and the decoder region XDR of the semiconductor memory device 100 shown in FIG. 2, components that are formed together with the components of the cell region CR and the dummy region DR may be easily manufactured according to the semiconductor memory device manufacturing method described with reference to FIGS. 9A to 9L. Therefore, a detailed description of a method of manufacturing the aforementioned components will be omitted.

Figure 9A:
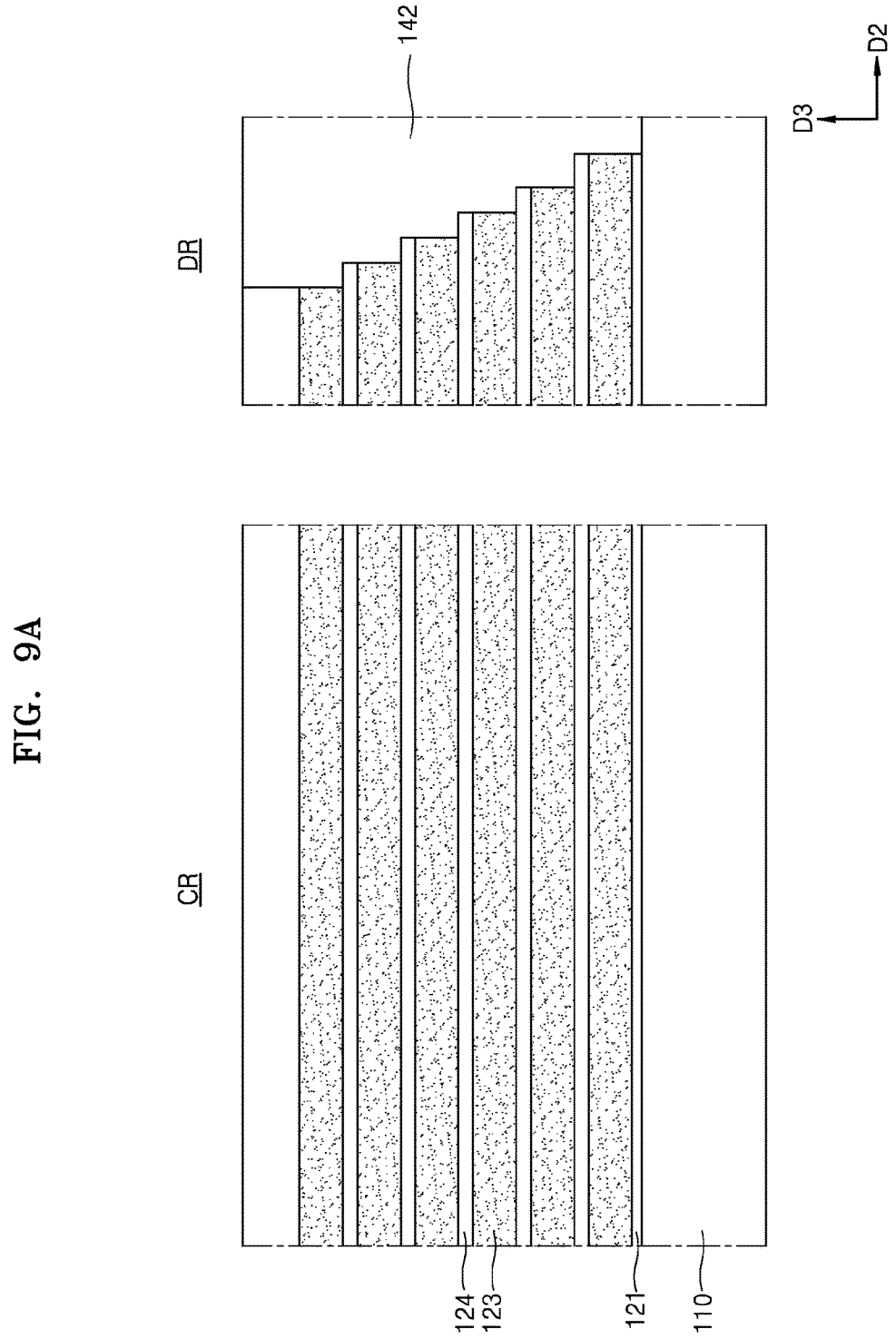

Referring to FIG. 9A, a substrate 110 including a cell region CR and a dummy region DR is provided. The substrate 110 may have a first conductivity type, for example, a P type. A buffer dielectric film 121, a plurality of sacrificial films 123, and a plurality of insulating films 124 may be formed above the substrate 110. The buffer dielectric film 121 may include, for example, a silicon oxide, a silicon nitride, a silicon oxynitride, a gallium oxide, a germanium oxide, a high-k dielectric, or any combination thereof. The buffer dielectric film 121 may be a film of silicon oxide formed by, for example, thermal oxidation. The sacrificial films 123 and the insulating films 124 may be alternately stacked above the buffer dielectric film 121. The uppermost insulating film 124 may be thicker than the other insulating films. The insulating films 124 may be, for example, films of silicon oxide. The sacrificial films 123 may include a material having an etching select ratio with respect to the buffer dielectric film 121 and the insulating films 124. For example, the sacrificial films 123 may include a material whose wet etching characteristics are different from those of the buffer dielectric film 121 and the insulating film 124. The sacrificial films 123 may each be, for example, a silicon nitride film, a silicon oxynitride film, a polysilicon film, or a polysilicon-germanium film. The sacrificial films 123 and the insulating films 124 may be formed by, for example, chemical vapor deposition (CVD).

As among the plurality of sacrificial films 123 and the plurality of insulating films 124, the sacrificial films 123 and the insulating films 124 in a lower area may be larger (i.e., have a larger footprint or surface area) than the sacrificial films 123 and the insulating films 124 in an upper area. In some examples of the inventive concept, the plurality of sacrificial films 123 and the plurality of insulating films 124 may have a pyramidal form on the substrate 110. The sacrificial films 123 and the insulating films 124 may be formed as stair-steps in the dummy region DR. The interlayer insulating layer 142 may be formed above the substrate 110 in the dummy region DR. The interlayer insulating layer 142 may have an upper face that is at the same level as the upper surface of the uppermost insulating film 124. In some examples of the inventive concept, the interlayer insulating layer 142 may be formed together with the uppermost insulating film 124, and thus be unitary with the uppermost insulating film 124.

Figure 9B:
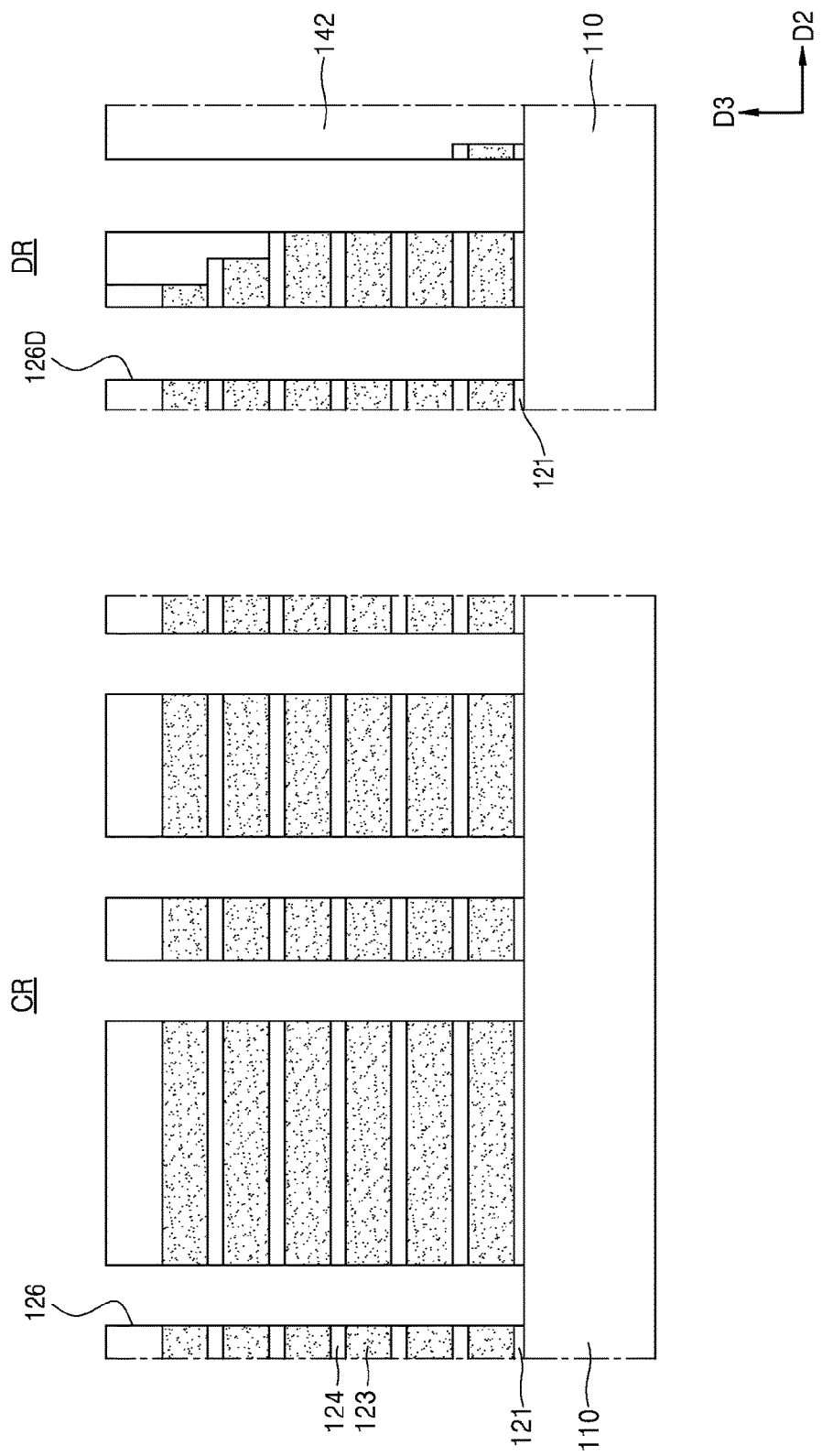

Referring to FIG. 9B, a plurality of vertical holes 126 and 126D is formed through the buffer dielectric film 121, the plurality of sacrificial films 123, the plurality of insulating films 124, and/or the interlayer insulating layer 142 to expose the substrate 110. The vertical hole 126D of the dummy region DR may have a greater width than the vertical hole 126 of the cell region CR. The vertical pillar PL the example of FIG. 3C may be formed in the vertical hole 126 of the cell region CR, and the dummy vertical pillar PLD of the example of the example of FIGS. 5A and 5B may be formed in the vertical hole 126D of the dummy region DR.

Figure 9C:
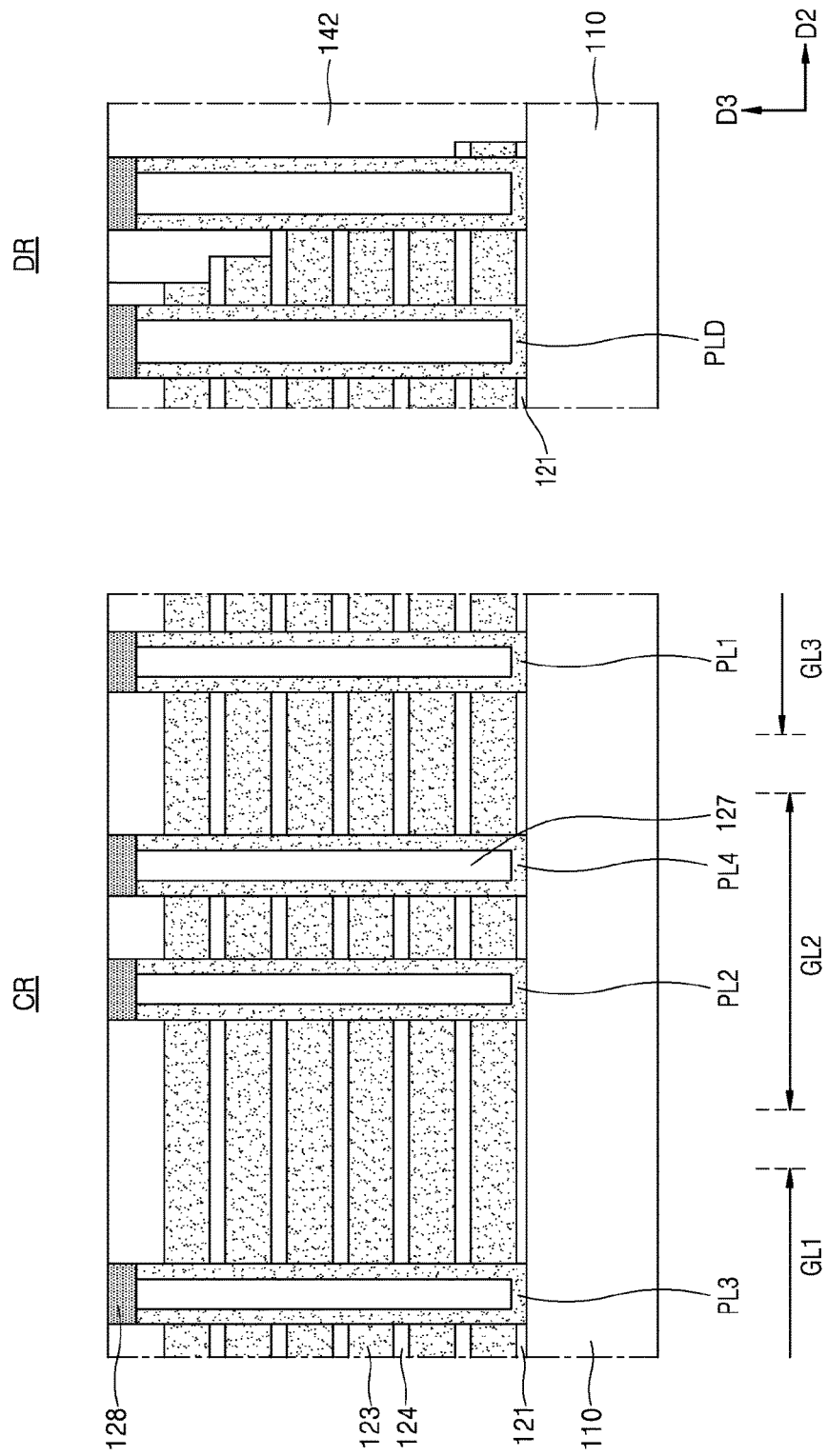

Referring to FIG. 9C, the vertical pillars PL1, PL2, PL3, and PL4 and the dummy vertical pillar PLD are formed in the plurality of vertical holes 126 and 126D the example of FIG. 9B. The dummy vertical pillar PLD may be formed in the same manner as the vertical pillars PL1, PL2, PL3, and PL4. The dummy vertical pillar PLD may have a greater width than the vertical pillars PL1, PL2, PL3, and PL4.

The vertical pillars PL1, PL2, PL3, and PL4 and the dummy vertical pillar PLD may comprise first-conductivity-type semiconductor films. The semiconductor film may not completely fill the plurality of vertical holes 126 and 126D. An insulating material layer may be formed after the semiconductor film to completely fill what remains of the plurality of vertical holes 126 and 126D. The semiconductor film and the insulating material layer may be planarized to expose the insulating film 124 and the interlayer insulating layer 142 at the uppermost level. Thus, the vertical pillars PL1, PL2, PL3, and PL4 and the dummy vertical pillar PLD may be formed to have hollow cylinder-shapes whose inner regions are filled with filling insulating films 127. In some examples of the inventive concept, the semiconductor film may be formed to completely fill the plurality of vertical holes 126 and 126D. Upper portions of the vertical pillars PL1, PL2, PL3, and PL4 and the dummy vertical pillar PLD may be recessed and therefore, the vertical pillars PL1, PL2, PL3, and PL4 and the dummy vertical pillar PLD may have a top surface lower than a top surface of the insulating film 124 and the interlayer insulating layer 142 at the uppermost level. Conductive patterns 128 may be formed in the recesses above upper portions of the vertical pillars PL1, PL2, PL3, and PL4 and the dummy vertical pillar PLD. The conductive patterns 128 may be formed of a doped polysilicon or a metal. Alternatively, second-conductivity-type impurity ions may be injected into the upper portions of the vertical pillars PL and/or the conductive patterns 128 to form drain regions. For example, the second conductivity type may be an N-type.

In some examples of the inventive concept, the vertical pillars PL1, PL2, PL3, and PL4 and the dummy vertical pillar PLD may be conductive pillars. The vertical pillars PL1, PL2, PL3, and PL4 and the dummy vertical pillar PLD may include at least one conductive material of, for example, doped polysilicon, metal, conductive metal nitride, silicide, or nanostructures such as carbon nanotubes or graphene.

Referring to FIG. 9D, the buffer dielectric film 121, the plurality of sacrificial films 123, and the plurality of insulating film 124 may be successively patterned to form isolation regions 131 spaced apart from one another. The isolation regions 131 may extend in the first direction D1 of FIG. 3A and may expose the substrate 110. Patterned insulating films (refer to FIG. 9C) may correspond to insulating patterns 125. The isolation region 131 may also be formed at a boundary between the cell region CR and the dummy region DR or inside the dummy region DR.

Figure 9E:
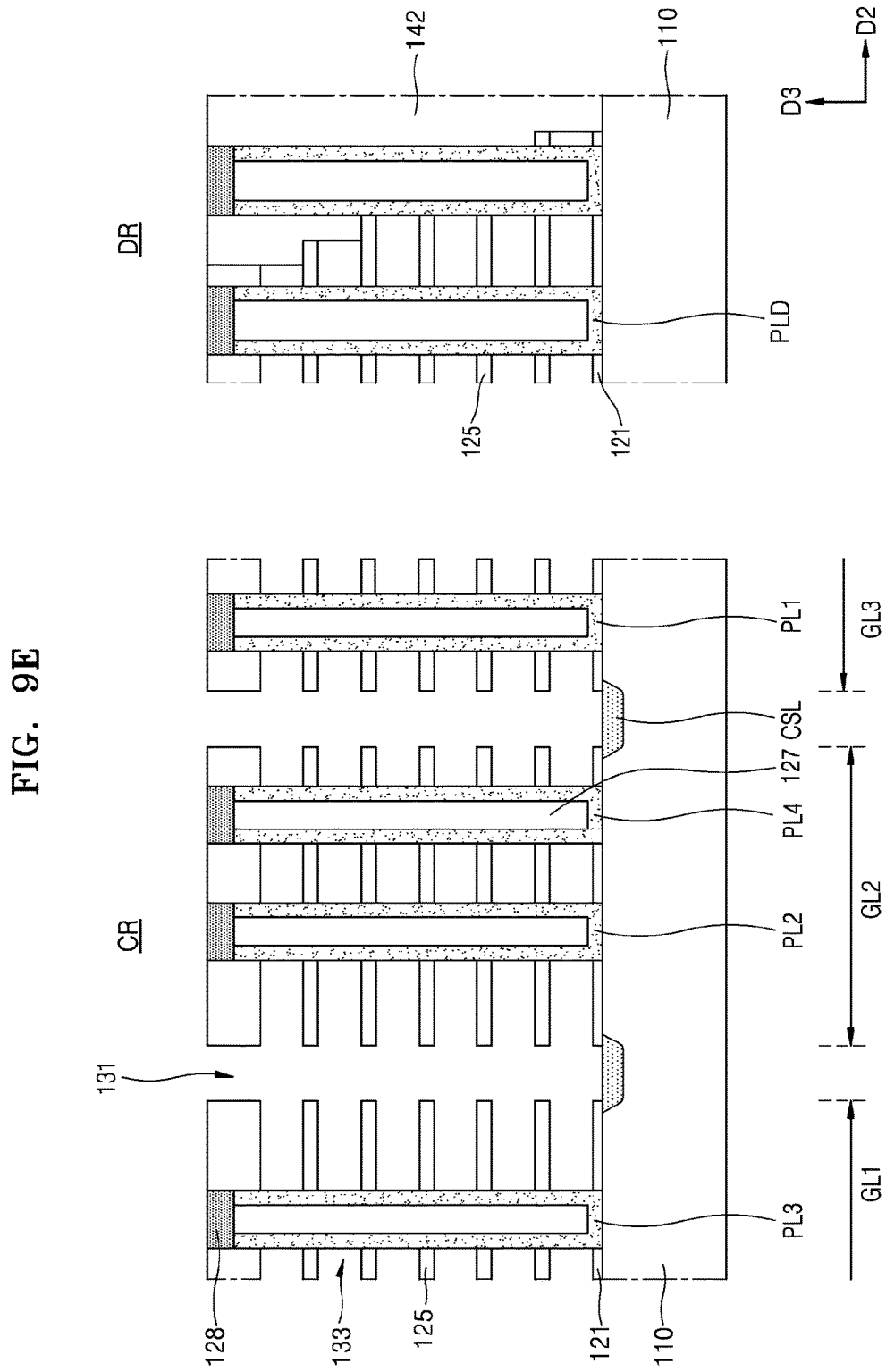

Referring to FIG. 9E, the sacrificial films (123 in FIG. 9D) exposed by the isolation regions 131 may be selectively removed to form recess regions 133. The recess regions 133 may correspond to regions from which the sacrificial films 123 have been removed. The recess regions 133 may be defined by the vertical pillars PL1, PL2, PL3, and PL4, the dummy vertical pillar PLD, the insulating patterns 125, and the interlayer insulating layer 142. When the sacrificial films 123 include silicon nitride films or silicon oxynitride films, the removal process of the sacrificial films 123 may be performed using a wet etching solution including phosphoric acid. Sides of the vertical pillars PL1, PL2, PL3, and PL4 and the dummy vertical pillar PLD are partially exposed by the recess regions 133.

Information storage elements of any of the types shown in and described with reference to FIGS. 4A-I, for example, may be formed (as will be described in more detail later on).

Referring to FIG. 9F, a conductive film may be formed over the information storage element to fill the recess region 133 and the isolation region 131. The conductive film may include at least one of a doped silicon film, a metal film, a metal nitride film and a metal silicide film. The conductive film may be formed by an atomic layer deposition (ALD) process.

The conductive film may be removed from the isolation regions 131 to form the gate electrodes G1 to G6 and the dummy gate electrodes G1D to G6D in the recess regions 133. The gate electrodes G1 to G6 of the cell region CR may extend in the first direction D1. The gate structures GL of the cell region CR may include the gate electrodes G1 to G6, and the dummy gate structure GLD of the dummy region DR may include the dummy gate electrodes G1D to G6D. The interlayer insulating layer 142 has an interface with an outer peripheral side of the stack of electrodes which in this example is constituted by the gate electrodes G1 to G6 and the dummy gate electrodes G1D to G6D.

The gate structure GL may include the first to third gate structures GL1, GL2, and GL3 that are sequentially arranged in the second direction D2. The gate structure GL may be coupled to the first to fourth vertical pillars PL1, PL2, PL3, and PL4.

Second-conductivity-type impurity ions may be injected into the substrate 110, which is exposed by removing the conductive film from the isolation regions 131, to form the common source lines CSL.

In some examples of the inventive concept, the information storage element 135 the example of FIG. 4A may be first formed in a portion of the recess regions 133, and the conductive film may be formed over the information storage element 135 to fill the remaining portion of the recess regions 133 and the isolation region 131.

In some examples of the inventive concept, each information storage element 135 may include a tunnel insulating film contacting the vertical pillars PL1, PL2, PL3, and PL4, a charge storage film above the tunnel insulating film, and a blocking insulating film above the charge storage film (refer to FIGS. 4A and 4E). In this case, the vertical pillars PL1, PL2, PL3, and PL4 may be semiconductor pillars. The tunnel insulating film may be formed by thermal oxidation of the vertical pillars PL1, PL2, PL3, and PL4 exposed by the recess regions 133. On the other hand, the tunnel insulating film may be formed by an atomic layer deposition (ALD) method. Each of the charge storage film and the blocking insulating film may be formed by an ALD method and/or a chemical vapor deposition (CVD) method having an excellent step coverage property.

In some examples of the inventive concept, when each information storage element 135 has one of the structures of the examples of the examples of FIGS. 4B to 4D, at least one of the tunnel insulating film, the charge storage film, and the blocking insulating layer of the information storage element 135 may be formed in the vertical holes 126 and 126D before the vertical pillars PL1, PL2, PL3, and PL4 and the dummy vertical pillar PLD are formed.

In some examples of the inventive concept, as described with reference to FIGS. 4F to 4H, each information storage element 135 may comprise a variable resistance pattern. The vertical pillars PL1, PL2, PL3, and PL4 and the dummy vertical pillar PLD may be conductive pillars including at least one of, for example, a doped semiconductor, a metal, a conductive metal nitride, a silicide, and nanostructures such as carbon nanotubes or graphene. When each information storage element 135 has the structure shown in FIG. 4G, the information storage elements 135 may be formed in the vertical holes 126 and 126D before formation of the vertical pillars PL1, PL2, PL3, and PL4 and the dummy vertical pillar PLD.

In some examples of the inventive concept, as described with reference to FIG. 4I, the self-rectifying material SW that contacts the vertical pillars PL1, PL2, PL3, and PL4 may be formed before forming the information storage elements 135.

Figure 9G:
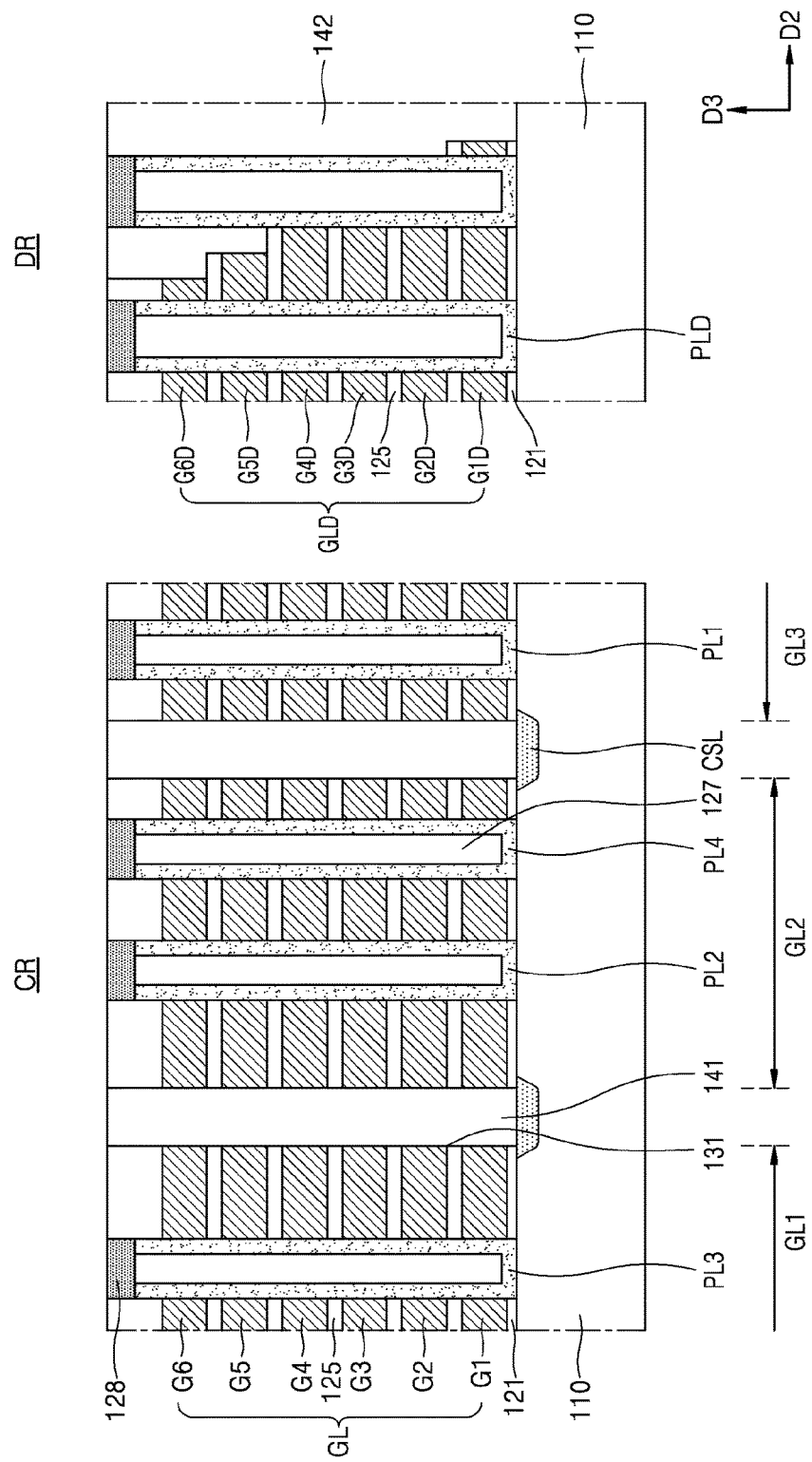
Figure 9H:
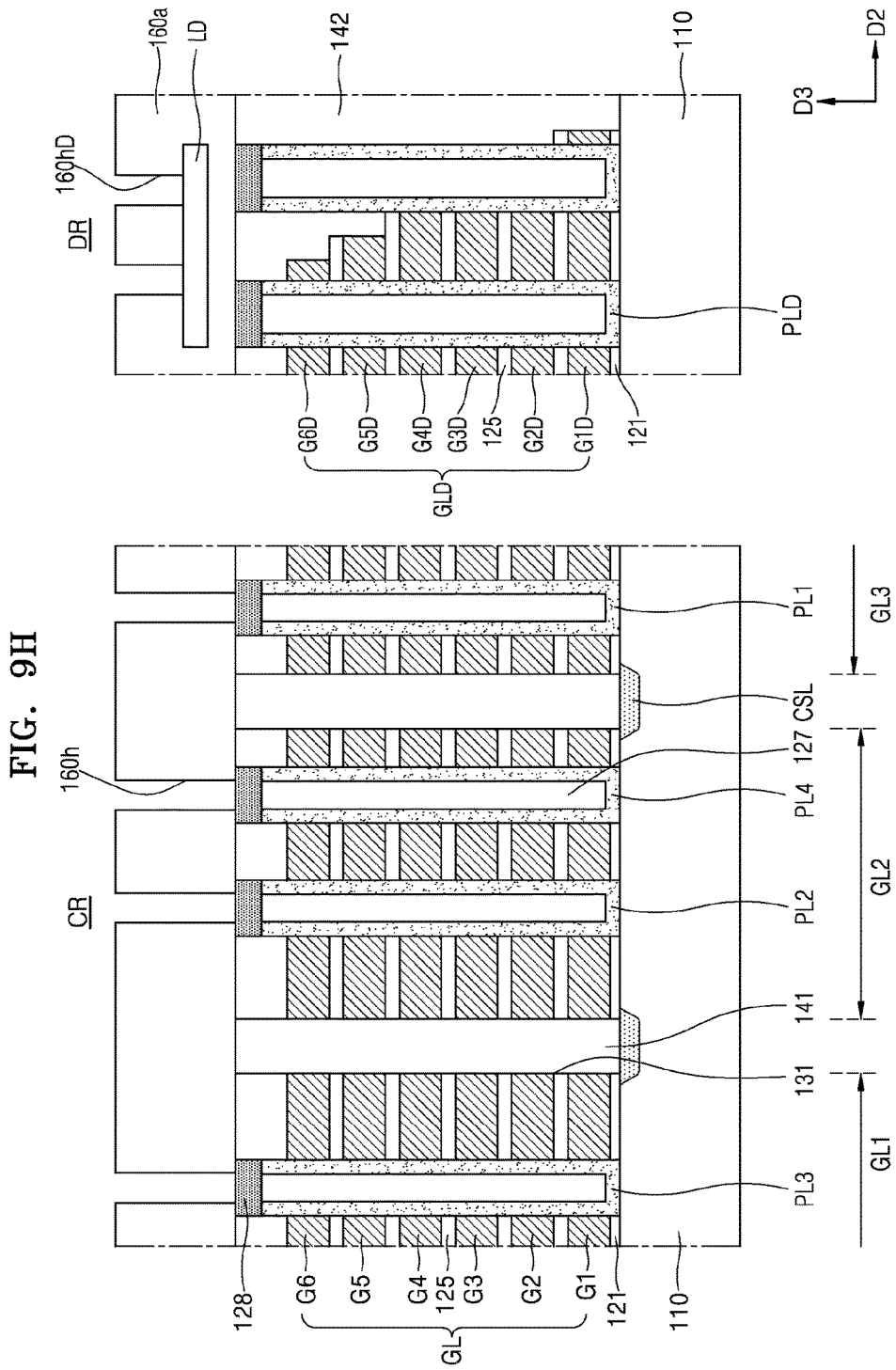

Referring to FIGS. 9G and 9H, after forming the isolation insulating film 141 that fills the isolation regions 131, a first IMD 160a is formed to cover the cell region CR and the dummy region DR.

Selectively, the dummy line pattern LD may be formed in the dummy region DR in the first IMD 160a. To this end, the first IMD 160a may have a multi-layered structure including a portion formed before forming the dummy line pattern LD and a portion formed after forming the dummy line pattern LD.

After the first IMD 160a is formed, via holes 160h and 160hD are formed in the first IMD 160a. The via hole 160h of the cell region CR may penetrate through the first IMD 160a. The via hole 160hD of the dummy region DR may extend from an upper surface of the first IMD 160a to an inner area so that the dummy line pattern LD is exposed. The via hole 160h of the cell region CR may be deeper than the via hole 160hD of the dummy region DR.

Referring to FIG. 9I, a supporting layer 170 is formed to cover the first IMD 160a and fill the via holes 160h and 160hD.

In some examples of the inventive concept, the supporting layer 170 may be a spin-on hardmask (SOH). If the via hole 160hD of dummy region DR were not formed, the supporting layer 170 of the cell region CR would fill the via hole 160h, but would only be situated above the first IMD 160a in the dummy region DR. Therefore, in this hypothetical case, the supporting layer 170 would have a thicker upper surface, i.e., an upper surface at a higher level, in the dummy region DR than in the cell region CR. This would result in a relatively small depth of focus (DOF) margin being available for a photo-processing operation performed in subsequent processes.

However, according to an aspect of the inventive concept, the via hole 160hD is formed in the dummy region DR, and the supporting layer 170 when formed fills the via hole 160hD of the dummy region DR. Accordingly, a step difference between the supporting layer 170 in the cell region CR and the supporting layer 170 in the dummy region DR may be minimized, and thus, a relatively great DOF margin may be secured for a photo-processing operation to be performed in subsequent processes.

Figure 9J:
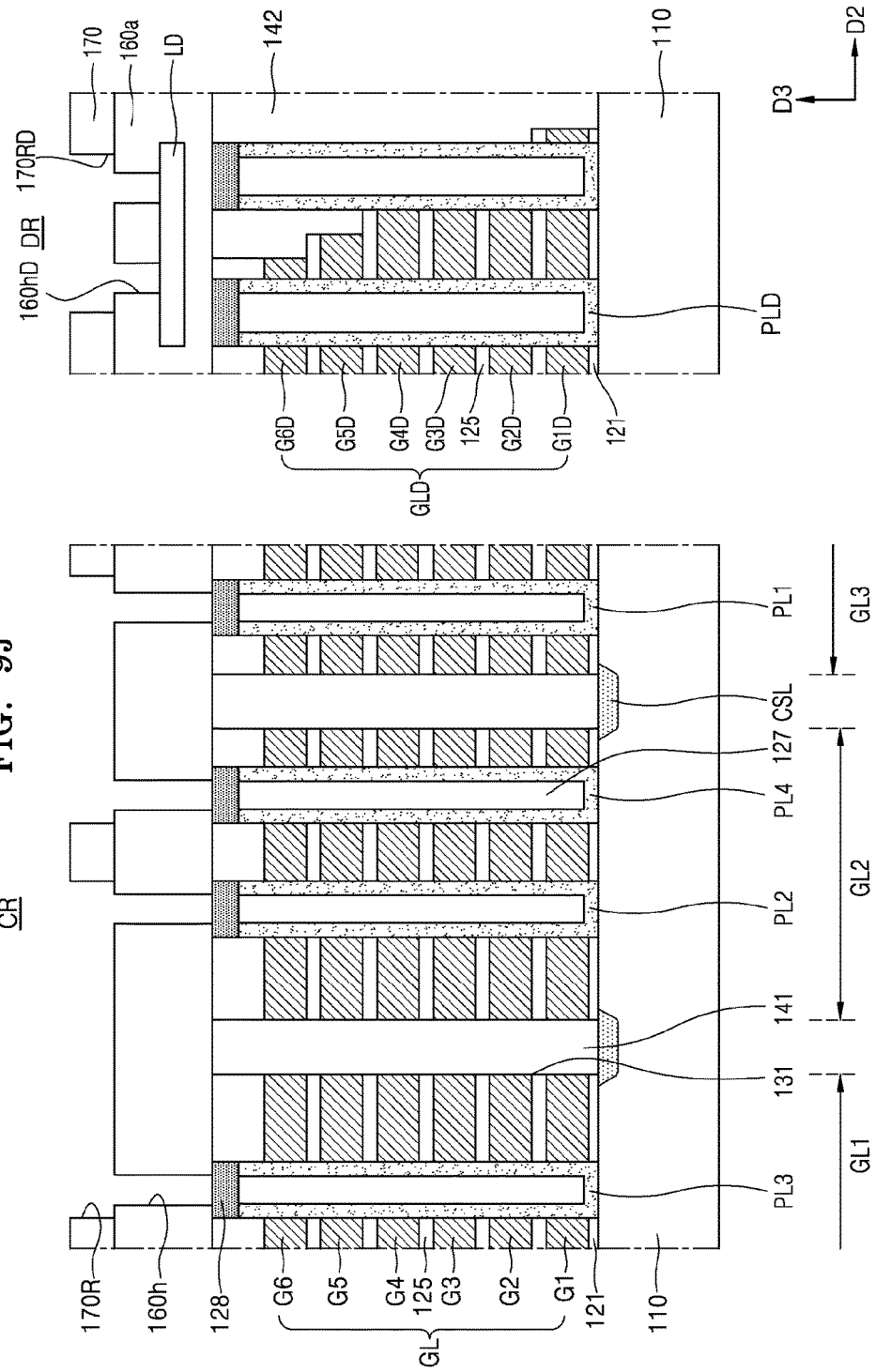

Referring to FIG. 9J, a portion of the supporting layer 170 may be removed to form first recesses 170R and 170RD that expose the via holes 160*h* and 160*h*D. That is, the first recesses 170R and 170RD may be open to the via holes 160*h* and 160*h*D. Photo-processing and etching may be performed to form the first recesses 170R and 170RD.

Referring to FIGS. 9J and 9K, a portion of the first IMD 160*a* that is exposed through the first recesses 170R and 170RD may be removed to form second recesses 160R and 160RD that are open to the via holes 160*h* and 160*h*D.

Then, a metal material layer 180 that fills the via holes 160*h* and 160*h*D and the second recesses 160R and 160RD is formed on the first IMD 160*a*.

Figure 9L:
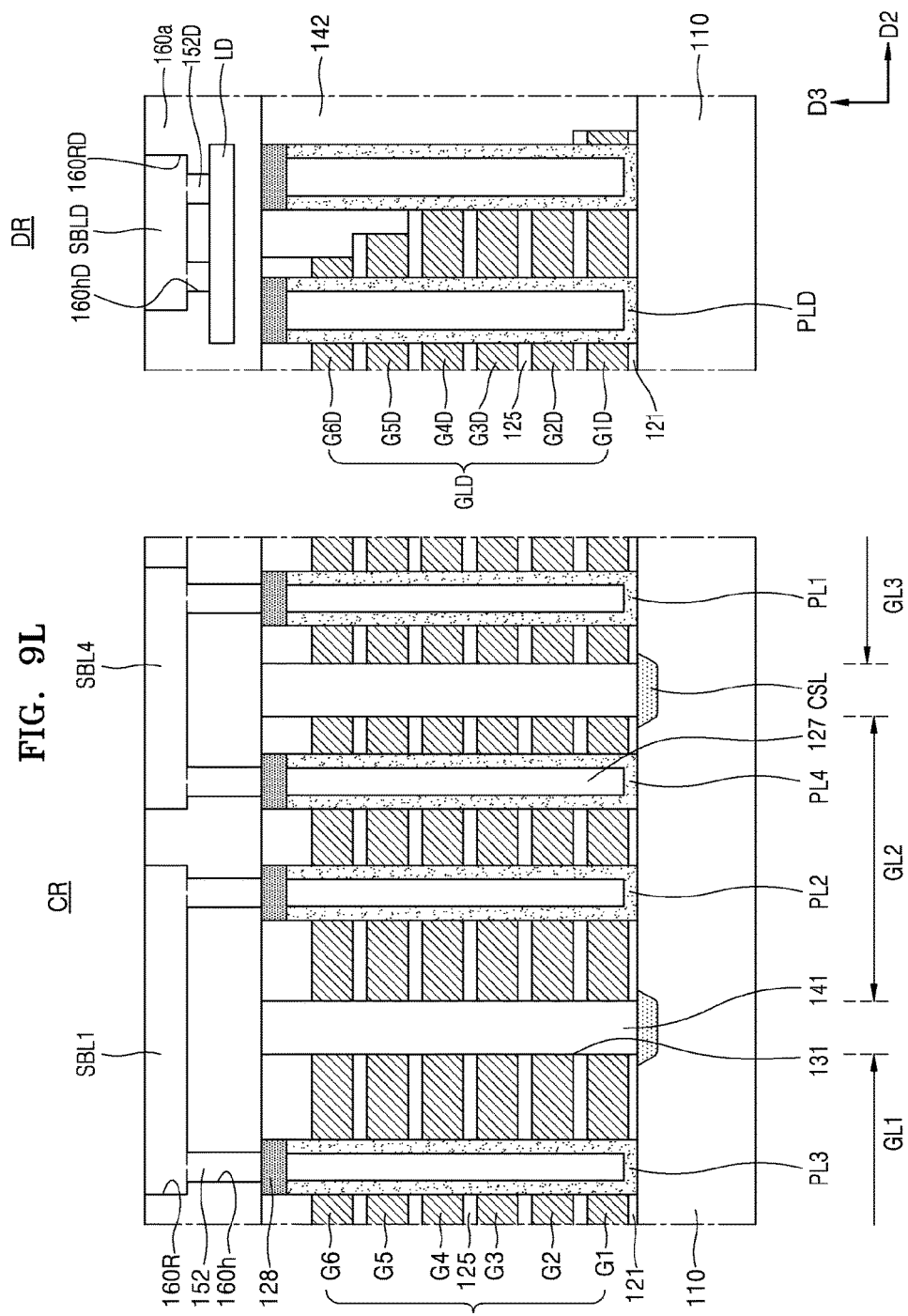

Referring to FIGS. 9K and 9L, a planarization process is performed to remove the metal material layer 180 from an upper surface of the first IMD 160*a*. The planarization process may be, for example, CMP.

The remainder of the metal material layer 180 may include lower via plug 152 filling the via hole 160*h* of the cell region CR, connection lines SBL1 and SBL4 filling the second recesses 160R, dummy via plug 152D filling the via hole 160*h*D of the dummy region DR, and a dummy connection line SBLD filling the second recess 160RD. The dummy connection line SBLD is a dummy pattern that spans a region of the IMD 160 which lies directly above the interface between the interlayer insulating layer 140 and the stack of electrodes.

Therefore, the dummy connection line SBLD may minimize a step difference between upper surfaces of the metal material layer 180 in various regions, e.g., between the dummy region DR and the cell region CR, during the CMP process of removing the metal material layer 180 from the upper surface of the first IMD 160*a*.

Afterwards, the upper via plug 154, the bit lines BL, and the second IMD shown in FIGS. 3A to 3C and FIGS. 5A and 5B are formed. The IMD 160 shown in FIGS. 3A to 3C, FIGS. 5A and 5B may have a multi-layer structure in which the first IMD 160*a* and the second IMD are stacked.

Figure 10A:
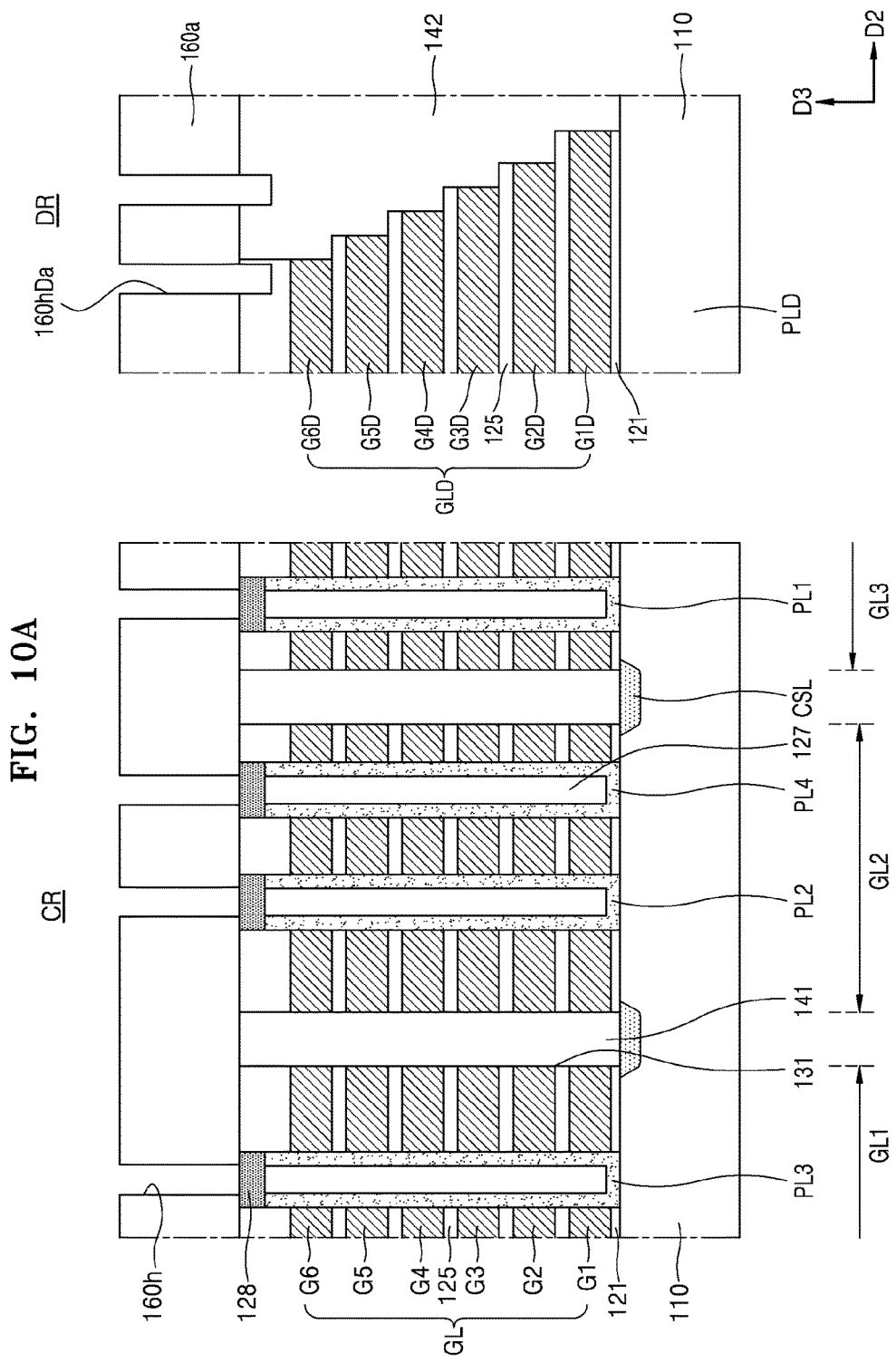

FIGS. 10A to 10B are cross-sectional views for use in illustrating another example of a method of manufacturing a semiconductor memory device, according to the inventive concept. FIG. 10A is a cross-sectional view showing a process after a process shown in FIG. 9G. A description of aspects of the method that have been described above with reference to FIGS. 1 to 9L may be omitted. In particular, FIGS. 10A and 10B show a method of manufacturing the cell region CR of the example of FIGS. 3A to 3C and the dummy region DR of the example of FIGS. 6A and 6B.

Referring to FIGS. 10A and 10B, after forming the isolation insulating film 141 that fills the isolation regions 131, the first IMD 160*a* is formed to cover the cell region CR and the dummy region DR.

After the first IMD 160*a* is formed, the via hole 160*h* and a via hole 160*h*Da are formed in the first IMD 160*a*. The via hole 160*h* of the cell region CR may penetrate through the first IMD 160*a*.

The via hole 160*h*Da of the dummy region DR may be deeper than the via hole 160*h* of the cell region CR. In some examples of the inventive concept, the via hole 160*h*Da of the dummy region DR may penetrate through the first IMD 160*a*, extend into an uppermost insulating pattern 125 and/or the interlayer insulating layer 142, and not expose the uppermost dummy gate electrode G6D. In some examples of the inventive concept, the via hole 160*h*Da of the dummy region DR may penetrate through the first IMD 160*a*, extend into the uppermost insulating pattern 125 and/or the interlayer insulating layer 142, and expose the uppermost dummy gate electrode G6D.

Afterwards, by using the methods described with reference to FIGS. 9I and 9L, the lower via plug 152 and the connection lines SBL1, SBL2, SBL3, and SBL4 shown in FIGS. 3A to 3C and the dummy via plug 152Da and the dummy connection line SBLD (dummy pattern) shown in FIGS. 6A and 6B may be formed.

Figure 11:
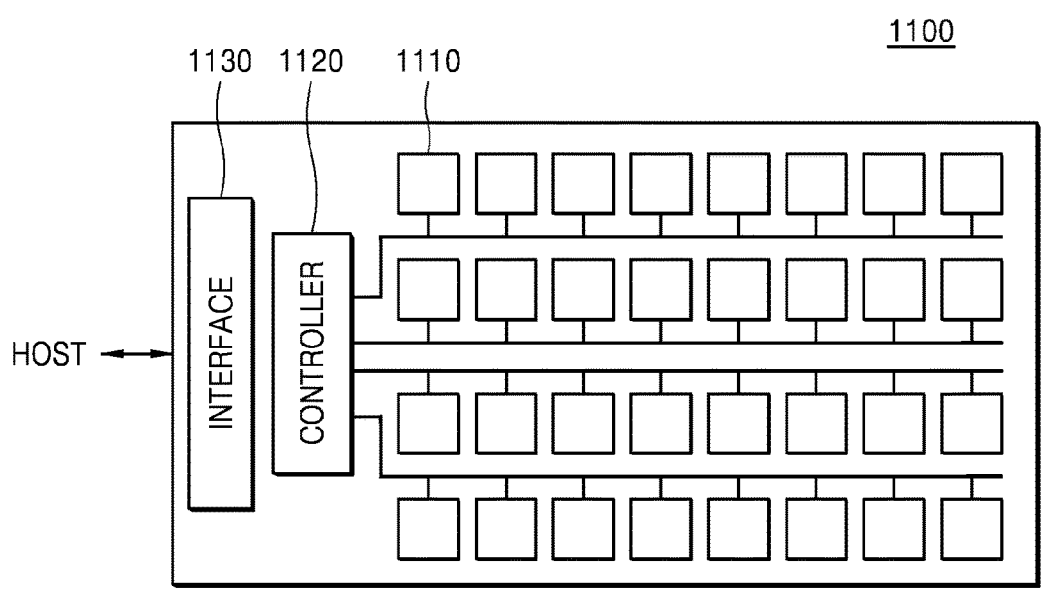
FIG. 11 is a diagram of an electronic device including a semiconductor memory device, according to example of the inventive concepts, as exemplified by a solid state drive.

FIG. 11 is a diagram of an electronic device including a semiconductor memory device, according to the inventive concepts, as exemplified by a solid state drive.

Referring to FIG. 11, a solid state drive 1100 may include a plurality of non-volatile memories 1110 and a controller 1120. The non-volatile memory 1110 may store data. The non-volatile memory 1110 may have non-volatile characteristics such that stored data is retained even when power is not supplied thereto. The non-volatile memory 1110 may be any of the examples of a semiconductor memory device described and fabricated with reference to FIGS. 1 to 10B.

The controller 1120 may read data stored in the non-volatile memory 1110 or may store data in the non-volatile memory 1110 in response to a read/write request from a host. An interface 1130 may transmit or receive a command and an address signal to and from the host. The interface 1130 may again transmit or receive the command and the address signal to and from the non-volatile memory 1110 through the controller 1120.

The solid state drive 1100 may further include an active element or a passive element, such as a resistor, a capacitor, an inductance, a switch, a temperature sensor, a DC-DC converter, quartz for clock generation, or a voltage regulator.

Figure 12:
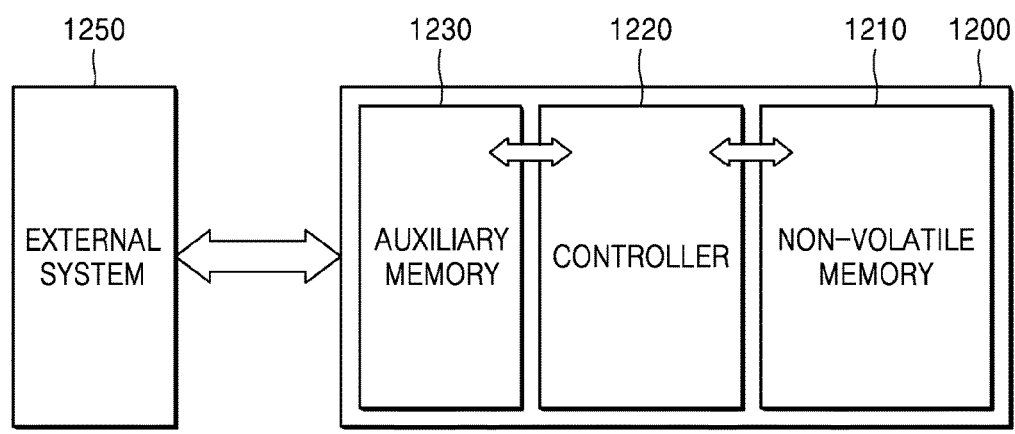
FIG. 12 is a block diagram of a relationship between an external system and an electronic device including a semiconductor memory device exemplified as a solid state drive, according to the inventive concept.

FIG. 12 is a block diagram of a relationship between an external system and an electronic device including a semiconductor memory device according to the inventive concept as exemplified by a solid state drive.

Referring to FIG. 12, data input by an external system 1250 may be stored in a solid state drive 1200. The solid state drive 1200 may include a non-volatile memory device 1210, a controller 1220, and an auxiliary memory device 1230. The non-volatile memory device 1210 may be any of the examples of a semiconductor memory device 100 described and fabricated with reference to FIGS. 1 to 10B.

The data input by the external system 1250 may be stored in the non-volatile memory device 1210 through the auxiliary memory device 1230 and the controller 1220. Also, the controller 1220 may read data from the non-volatile memory device 1210 through the auxiliary memory device 1230 and transmit the data to the external system 1250.

Figure 13:
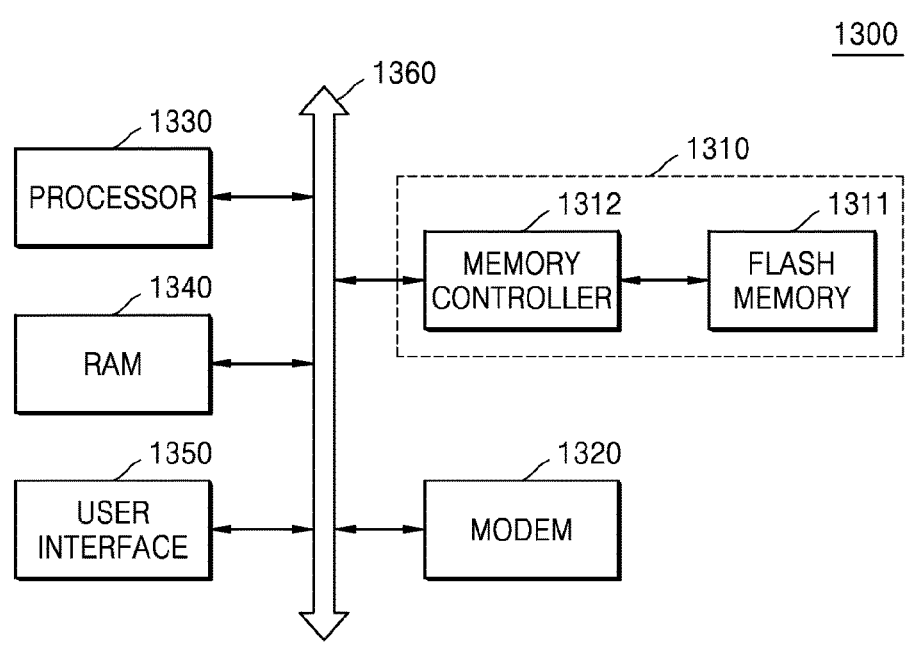
FIG. 13 is a block diagram of a system according to the inventive concept.

FIG. 13 is a block diagram of a data storage system according to the inventive concept.

Referring to FIG. 13, a data storage system 1300 may include a processor 1330, such as a central processing unit (CPU) performing communication through a common bus 1360, a random access memory 1340, a user interface 1350, and a modem 1320. Each of the components may transmit a signal to a storage device 1310 or receive a signal from the storage device 1310 through the common bus 1360. The storage device 1310 may include a flash memory device 1311 and a memory controller 1312. The flash memory device 1311 may store data. The flash memory device 1311 may have non-volatile characteristics such that stored data is retained even when power is not supplied thereto. The flash memory 1310 may be any of the examples of a semiconductor memory device 100 described and fabricated with reference to FIGS. 1 to 10B.

A semiconductor memory device according to the inventive concept may in effect increase a DOF margin and accuracy during a photo-processing operation by minimizing step differences between various regions in the top of the device during the course of its manufacture. Accordingly, a semiconductor memory device with a higher integration degree and improved reliability may be manufactured.

Although the inventive concept has been particularly shown and described with reference to examples of the inventive concept, it will be understood that various changes in form and details may be made thereto without departing from the spirit and scope of the inventive concept defined in the following claims.

What is claimed is:

1. A semiconductor memory device comprising:
    a substrate extending in a cell region and a dummy region of the device;
    a plurality of vertical pillars on the substrate in the cell region;
    inter metal dielectric (IMD) extending in the cell region over the vertical pillars and in the dummy region;
    a plurality of bit lines extending on an upper part of the IMD;
    a plurality of connection lines in the IMD in the cell region and extending over the vertical pillars;
    a plurality of lower via plugs extending vertically in the IMD in the cell region, disposed on the vertical pillars, each of the lower via plugs connecting one of the vertical pillars to one of the connection lines;
    a plurality of upper via plugs extending vertically in the IMD in the cell region and disposed on the plurality of connection lines, each of the upper vial plugs connecting one of the connection lines to one of the bit lines;
    a dummy connection line in the IMD in the dummy region and extending at the same level as the connection lines with respect to a main surface of the substrate; and
    a dummy via plug extending vertically in the IMD in the dummy region, connected to the dummy connection line at the bottom of the dummy connection line and having a height different than that of each of the lower via plugs,
    wherein the dummy connection line has an upper surface at a level below that of bottom surfaces of the plurality of bit lines and is electrically insulated from the plurality of bit lines.

2. The semiconductor memory device of claim 1, wherein the dummy connection line and the dummy via plug are buried in the IMD as floating therein so as to be electrically isolated in the device.

3. The semiconductor memory device of claim 2, further comprising:
    a dummy vertical pillar on the substrate in the dummy region; and
    a dummy line pattern in the IMD between the dummy connection line and the dummy vertical pillar and connected to the dummy connection line via the dummy via plug.

4. The semiconductor memory device of claim 3, wherein the height of the dummy via plug is less than the height of each of the lower via plugs.

5. The semiconductor memory device of claim 3, wherein a width of the dummy vertical pillar is greater than a width of each of the vertical pillars.

6. The semiconductor memory device of claim 1, wherein the height of the dummy via plug is greater than the height of each of the lower via plugs.

7. The semiconductor memory device of claim 1, further comprising a page buffer circuit in a page buffer region, the dummy region being situated between the cell region and the page buffer region.

8. The semiconductor memory device of claim 7, wherein the dummy connection line and the dummy via plug are electrically insulated from the substrate and the bit lines.

9. The semiconductor memory device of claim 7, wherein the page buffer circuit comprises a first transistor in the page buffer region, and
    further comprising a first connection line electrically connecting the bit lines and the first transistor and provided at the same level as the connection lines with respect to the main surface of the substrate; and
    a first via plug connected to a lower surface of the first connection line, the height of the first via plug being greater than the height of each of the lower via plugs.

10. The semiconductor memory device of claim 9, wherein the height of the first via plug is equal to the height of the dummy via plug.

11. The semiconductor memory device of claim 9, wherein the height of the first via plug is greater than the height of the dummy via plug.

12. The semiconductor memory device of claim 1, wherein each of the connection lines and each of the lower via plugs connecting one of the vertical pillars to the connection line are unitary, and the dummy connection line and the dummy via plug are unitary.

13. A semiconductor memory device comprising:
    a substrate extending in a cell region and a dummy region of the device;
    a gate structure comprising a plurality of gate electrodes stacked one over another on the substrate in the cell region;
    a dummy gate structure comprising a plurality of dummy gate electrodes stacked one over another on the substrate in the dummy region;
    a plurality of vertical pillars coupled to the gate structure;
    a plurality of connection lines extending over the vertical pillars;
    a plurality of lower via plugs connecting the vertical pillars to the connection lines;
    a dummy connection line disposed at the same level as the connection lines with respect to a main surface of the substrate; and
    a dummy via plug connected to the dummy connection line at the bottom of the dummy connection line,
    wherein the vertical pillars, the connection lines, and the lower via plugs are situated in the cell region,
    the dummy connection line and the dummy via plug are situated in the dummy region, and
    the dummy connection line and the dummy via plug are electrically insulated from the substrate and the dummy gate structure.

14. The semiconductor memory device of claim 13, wherein the plurality of dummy gate electrodes has an outer peripheral side portion in the form of a set of stairs.

15. The semiconductor memory device of claim 13, wherein a lower surface of the dummy via plug is disposed at a higher level than a lower surface of each of the lower via plugs with respect to the main surface of the substrate.

16. A semiconductor memory device comprising:
    a substrate;

a three-dimensional array of memory cells on the substrate and comprising a stack of electrodes, and pillars extending upright on the substrate and vertically through the stack;

an interlayer dielectric layer disposed on the substrate and extending over the three-dimensional array of memory cells;

electrically conductive connection lines embedded in the interlayer dielectric layer;

lower via plugs extending vertically in the interlayer dielectric layer from bottoms of the connection lines and electrically connecting the pillars to the connection lines;

dummy structure comprising dummy metallization embedded in the interlayer dielectric layer and spanning a region of the interlayer dielectric layer located directly above an outer peripheral side portion of the stack, the dummy metallization being electrically isolated from the array of memory cells in the device;

an interlayer insulating layer on the substrate and part of which is disposed beside the stack such that an interface exists between the outer peripheral side portion of the stack and the interlayer insulating layer, the region of the interlayer dielectric spanned by the dummy metallization being disposed directly above the interface;

bit lines extending extending on an upper part of the interlayer dielectric layer above the connection lines and above the dummy metallization, and electrically isolated in the device from the dummy structure; and upper contact plugs electrically connecting the bit lines and the connections lines.

17. The semiconductor memory device of claim 16, wherein the dummy metallization includes dummy patterns disposed at the same level in the device as the connection lines.

18. The semiconductor memory device of claim 17, wherein the dummy structure further comprises dummy pillars extending upright on the substrate adjacent the outer peripheral side portion of the stack and electrically isolated from the memory cells; and at least one respective dummy via plug extending vertically in the interlayer dielectric layer from the bottom of each of the dummy patterns.

19. The semiconductor memory device of claim 18, wherein the dummy structure further comprises at least one respective dummy via plug extending vertically in the interlayer dielectric layer from the bottom of each of the dummy patterns, each said dummy via plug having a height that is greater than that of each of the lower via plugs.

* * * * *